US009664758B2

(12) United States Patent
Stemmer

(10) Patent No.: US 9,664,758 B2
(45) Date of Patent: May 30, 2017

(54) METHOD AND MAGNETIC RESONANCE SYSTEM TO GENERATE MULTIPLE MAGNETIC RESONANCE IMAGES

(71) Applicant: Alto Stemmer, Erlangen (DE)

(72) Inventor: Alto Stemmer, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 571 days.

(21) Appl. No.: 14/224,309

(22) Filed: Mar. 25, 2014

(65) Prior Publication Data

US 2014/0285195 A1    Sep. 25, 2014

(30) Foreign Application Priority Data

Mar. 25, 2013 (DE) .................. 10 2013 205 208

(51) Int. Cl.
   *G01V 3/00*     (2006.01)
   *G01R 33/48*    (2006.01)
   *G01R 33/561*   (2006.01)

(52) U.S. Cl.
   CPC ........ *G01R 33/4818* (2013.01); *G01R 33/482* (2013.01); *G01R 33/4824* (2013.01); *G01R 33/5616* (2013.01); *G01R 33/5618* (2013.01)

(58) Field of Classification Search
   CPC ............ G01R 33/4818; G01R 33/4824; G01R 33/5616; G01R 33/5618
   USPC ...................................... 324/309
   See application file for complete search history.

(56) References Cited

U.S. PATENT DOCUMENTS

| 5,581,181 | A | * | 12/1996 | Fuderer | G01R 33/56554 324/309 |
| 5,779,636 | A | | 7/1998 | Kanazawa | |
| 5,914,601 | A | * | 6/1999 | Goldfarb | G01R 33/56563 324/322 |
| 6,043,652 | A | * | 3/2000 | Liu | G01R 33/5615 324/309 |
| 7,535,222 | B2 | | 5/2009 | Bammer et al. | |
| 7,840,049 | B2 | | 11/2010 | Stemmer | |
| 7,868,615 | B2 | * | 1/2011 | Li | G01R 33/56509 324/307 |
| 8,948,536 | B2 | | 2/2015 | Boernert et al. | |
| 2006/0264735 | A1 | | 11/2006 | Stemmer | |
| 2009/0168084 | A1 | | 7/2009 | Seto | |
| 2013/0089271 | A1 | | 4/2013 | Boernert et al. | |

(Continued)

OTHER PUBLICATIONS

Yu et al: "A Multi-echo Acquisition Method with Reduced Echo Spacing for Robust Ideal Water-Fat Decomposition at 3T"; Proc. Intl. Soc. Mag. Reson. Med. 15 (2007), p. 3353.

(Continued)

*Primary Examiner* — Susan Lee
(74) *Attorney, Agent, or Firm* — Schiff Hardin LLP

(57) ABSTRACT

In a method and magnetic resonance system to determine multiple magnetic resonance images for respective different echo points in time, k-space is scanned on a segment-by-segment basis with at least two rectangular k-space segments, these being scanned line by line with respective k-space lines oriented parallel to one another. A short side of the rectangular k-space segments is oriented parallel to the k-space lines. First and second gradient echoes are respectively produced by a radio-frequency pulse radiated for each k-space line.

17 Claims, 15 Drawing Sheets

(56) References Cited

U.S. PATENT DOCUMENTS

2013/0170727 A1    7/2013   Kawamura et al.
2013/0307537 A1   11/2013   Yoshizawa et al.

OTHER PUBLICATIONS

Hwang et al: "Ramp sampling strageties for high resolution single-pass Dixon imaging at 3T" Proc. In. Soc. Reson. Med., vol. 15 (2010) p. 1044.
Larson et al: "Anisotropic Field-of-Views for Propeller MRI", Proc. Intl. Soc. Mag. Reson. Med. vol. 15 (2007), p. 1726.
Huo et al. "Parallel Imaging Method for Split-Blade Propeller DWI"; Proc.Intl.Soc.Mag.Reson.Med.vol. 16 (2008) p. 756.
Robson et al. "Diffusion Weighted Multiple Shot Echo Planar Imaging of Humans without Navigation". Msg. Reson. Med. vol. 38 (1997) pp. 82-88.
Reeder et al: "Quantitative Assessment of Liver Fat with Magnetic Resonance Imaging and Spectroscopy"; Journal of Magnetic Resonance Imaging vol. 34; (2011).

\* cited by examiner

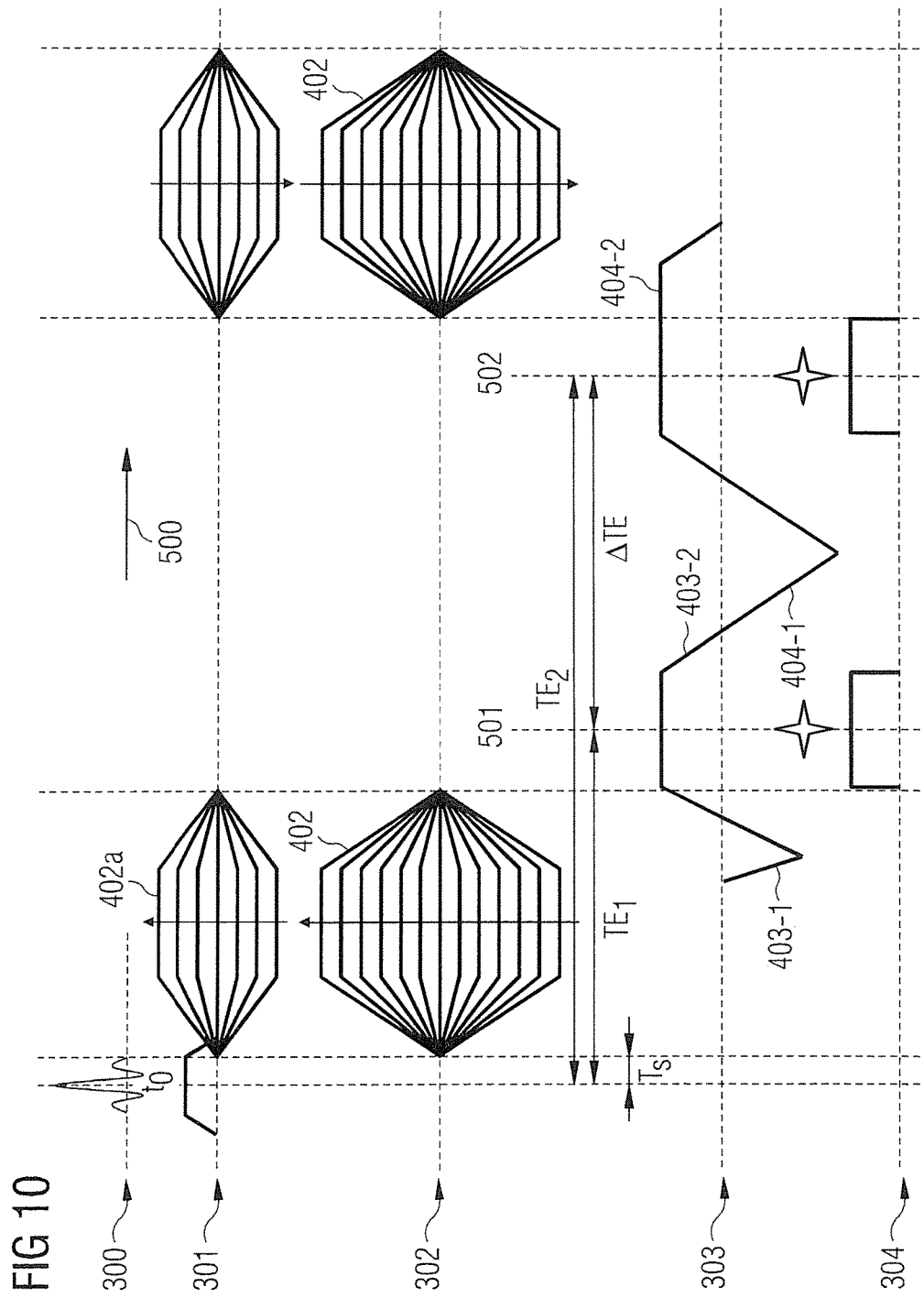

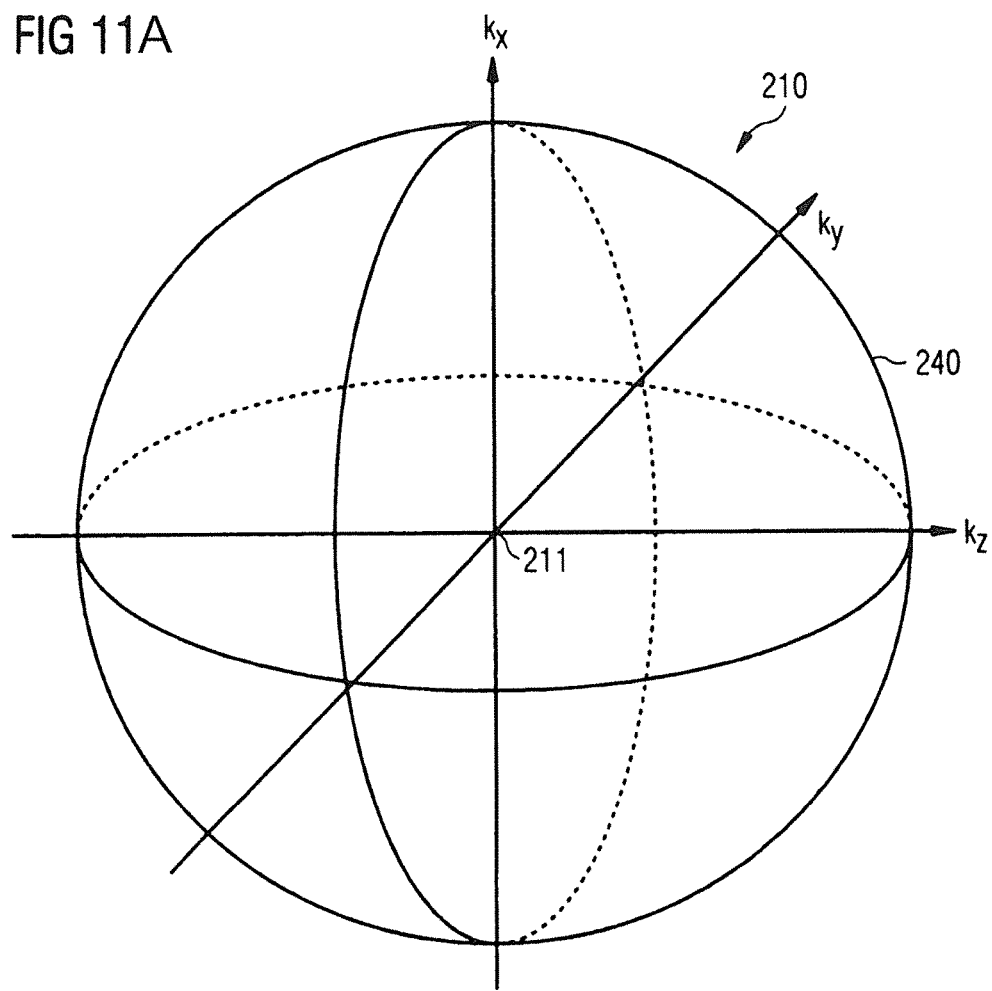

METHOD AND MAGNETIC RESONANCE SYSTEM TO GENERATE MULTIPLE MAGNETIC RESONANCE IMAGES

BACKGROUND OF THE INVENTION

Field of the Invention

The present invention concerns a method and a magnetic resonance apparatus to generate multiple magnetic resonance images of an examination subject. In particular, the invention concerns techniques that allow the generation of multiple magnetic resonance images with increased resolution for respective different echo points in time using a multi-echo magnetic resonance measurement sequence.

Description of the Prior Art

Multi-echo magnetic resonance (MR) measurement sequences are known in which multiple MR images with different echo times are respectively acquired from different anatomical slices of an examined person. Due to the different echo times, the multiple MR images typically have different contrasts. The MR images with different contrasts can be applied in what are known as chemical shift techniques in which a separation of different spin species occurs.

Multi-echo MR measurement sequences are frequently implemented such that MR images are obtained at very specific and well-defined echo times. For example, the specific selection of the echo times can depend on the desired application of the MR images. One example of a typical application would be fat/water separation. The sought echo times are typically dependent on the strength of the basic magnetic field (field strength-dependent), and in fact such that the echo time (TE1) of a first MR image and the distance between the echo times of successively acquired MR images ($\delta TE$) decreases inversely proportional to the strength of the basic magnetic field of the MR system. Typical basic magnetic field strengths would be 1.5 Tesla, 3 Tesla, 5 Tesla or 7 Tesla, for example.

Various types of multi-echo MR measurement sequences are known. In a conventional multi-echo MR measurement sequence, all detected MR echoes are detected (meaning at the various echo points in time) respectively as a time period after a separated radio-frequency (RF) pulse for excitation of the transverse magnetization (RF excitation pulse). In other words: a number n of MR echoes is detected in each of separate repetition intervals (TR intervals) after an RF excitation pulse. Therefore, such techniques are also known to those skilled in the art as an n-echo n-TR approach. N-echo n-TR techniques are known in connection with the detection of gradient echoes, for example. The resolution of an MR image in the readout direction (frequency encoding direction) is typically defined by the Fourier pixel size $\Delta x$. The Fourier pixel size is a size of a field of view in the readout direction, divided by the number of readout points Nx. The field of view designates a region of an examination subject that is depicted by the MR image. The smaller the Fourier pixel size $\Delta x$, the higher the resolution. The Fourier pixel size is inversely proportional to the 0th moment of the readout gradient:

$$\Delta x = 2\pi/(\gamma M0x).$$

wherein $\gamma$ is thereby the gyromagnetic ratio. For water protons, the gyromagnetic ratio is $\gamma/(2\pi)=42.576$ MHz/T. The 0th moment of the readout gradient is the time integral of the amplitude of the readout gradient during the readout time, frequently also designated as an "area" of the readout gradient. If the readout gradient is thus constant during the entire readout time, the 0th moment M0x is then the product of amplitude of the readout gradient and readout time.

In gradient echo imaging, a switch is frequently made between the excitation and readout gradients of a pre-phasing gradient pulse in the readout direction whose 0th moment has the same magnitude as the moment of the readout gradient between the beginning of the readout gradient and the echo point in time. The direction of the pre-phasing gradient pulse is typically opposite the direction of the readout gradient, such that the total moment disappears exactly at the echo point in time. The echo time is usually the time between the center of the excitation pulse and the echo point in time. For example, the echo time can also be the time between a spin echo and the echo point in time.

Since the maximum amplitude of a gradient pulse and the shortest rise time can typically be technologically and/or physiologically limited, the maximum resolution given gradient echo-based n-echo n-TR techniques is thus conventionally limited by the shortest required gradient echo time TE1, but not additionally by the shortest time difference $\Delta TE$ of successive gradient echoes. However, the total duration that is required to implement the multi-echo MR measurement sequence (measurement duration) is relatively long. Moreover, such a technique frequently extends the time interval between the detection of the different gradient echoes. This can lead to negative effects, in particular in measurements that are implemented to avoid breathing artifacts while an examined person holds his breath. Moreover, time-dependent drifts of the basic magnetic field, for example as a result of physiological processes or heating during the measurement, can lead to additional phase differences between the individual MR images with different echo points in time. A subsequent evaluation of the MR images can thereby be possible only to a limited extent, and possible quantitative analyses can be plagued with a comparably large error.

Other multi-echo MR measurement sequences are known than the n-echo n-TR-based measurement sequence described above. For example, multi-echo MR measurement sequences are also known which respectively detect multiple echoes at different echo points in time after a single RF excitation pulse. Due to the predetermined different echo points in time, given such multi-echo MR measurement sequences a maximum achievable spatial resolution is typically limited by the first echo time TE1, and additionally by the time difference between successive echoes. It is noted in particular that the time period provided for the detection of an echo is also limited in that the next echo should already be formed and detected after the time period $\Delta TE$.

The maximum gradient strength and/or a maximum rise time and fall time of gradient fields of an MR system is frequently technologically and/or physiologically limited. For example, for the detection of gradient echoes it is frequently necessary to initially switch pre-phasing gradient pulses and to subsequently switch readout gradient fields during the readout of the gradient echo. Since the time period available for this is typically limited by the predetermined different echo points in time, the maximum 0th moment M0x of the readout gradients (and therefore the achievable spatial resolution) is frequently limited accordingly. The detection of multiple MR echoes following one RF pulse is also known to the man skilled in the art as an n-echo per TR technique.

From the preceding it is apparent that multi-echo MR measurement sequences that use an n-echo per TR technique enable a reduced measurement duration and lower movement sensitivity, but have a relatively severely limited spatial resolution of the MR images. It is also apparent that multi-echo MR measurement sequences according to the n-echo n-TR technique enable high spatial resolutions of the MR images but require a relatively long measurement duration and are movement-sensitive. Therefore, the necessity typically exists to balance between the optimization variables of spatial resolution on the one hand and measurement duration on the other hand.

In order to solve this problem, hybrid techniques are also known which combine the n-echo per TR technique with the n-echo n-TR techniques. For example, see in this regard H. Yu et al., "A Multi-echo Acquisition Method with Reduced Echo Spacing for Robust IDEAL Water-Fat Decomposition at 3T" in Proc. Intl. Soc. Mag. Reson. Med. 15 (2007) 3353. There, of the necessary six echoes three are respectively detected in a total of two successive TR intervals. The achievable spatial resolution is then still limited only by the doubled echo spacing of the n-echo per TR technique. However, the measurement duration doubles approximately in comparison to the n-echo per TR technique, and the movement sensitivity increases.

SUMMARY OF THE INVENTION

Therefore, there is a need for improved multi-echo MR measurement sequences. In particular, a need exists for techniques which provide a comparably high spatial resolution of the acquired MR images. A need additionally exists for such techniques that are comparably movement-insensitive.

One aspect of the invention concerns a method to generate multiple MR images of an examination subject with increased resolution, respectively for different echo points in time using a multi-echo MR measurement sequence. In this method, the multi-echo MR measurement sequence scans k-space in segments, with at least two k-space segments. The at least two k-space segments are scanned line-by-line along k-space lines. For each k-space line, the multi-echo MR measurement sequence forms a first gradient echo at a first echo point in time and a second gradient echo at a later second echo point in time. For each k-space line, the method includes: radiate a radio-frequency pulse to manipulate a transverse magnetization and apply a phase encoding gradient field for phase encoding of a current k-space line; and readout the first gradient echo of the transverse magnetization manipulated by the radiated radio-frequency pulse for the current k-space line during the application of a first readout gradient field, wherein the first gradient echo is read out in a time interval around the first echo point in time; and readout the second gradient echo during the application of a second readout gradient field, wherein the second gradient echo is read out in a time interval around the second echo point in time. The at least two k-space segments are rectangular. A long side of the at least two k-space segments is oriented along a direction of the respective k-space segment that is defined by the phase encoding gradient field. A short side of the at least two k-space segments is oriented along a direction of the respective k-space segment that is defined by the readout gradient field. Multiple MR images are reconstructed from the k-space data organized in this manner.

The transverse magnetization is situated orthogonal to a longitudinal magnetization. The longitudinal magnetization is typically oriented along the basic magnetic field of the corresponding MR system.

The line-by-line scanning can take place with respective k-space lines oriented parallel to one another. The long side of the at least two k-space segments can be oriented orthogonal to the k-space lines, and the short side of the at least two k-space segments can be oriented along the k-space lines.

The line-by-line scanning of the k-space segment, for example along respective k-space lines oriented in parallel, is frequently designated as Cartesian scanning of the k-space segment, or as scanning of k-space with a Cartesian k-space trajectory.

In various embodiments, the echo point in time is the point in time of the formation of the gradient echo. For example, an echo time is defined as the time interval between the RF pulse (more precisely what is known as the isodelay point in time of the RF pulse) and the echo point in time. For example, the RF pulse can be an RF excitation pulse. The isodelay point in time of the RF excitation pulse is typically the point in time within the radiation time period of the RF excitation pulse as of which spins excited by the RF excitation pulse can be considered as being located in the transverse plane (thus orthogonal to the longitudinal magnetization). The time between the isodelay point in time of the RF excitation pulse of the RF excitation pulse and the end of the RF excitation pulse serves for calculation of the moment of a slice refocusing gradient, for example. This slice refocusing gradient has an inverted algebraic sign relative to the slice selection gradient, for example. In various scenarios, the refocusing gradient is switched (activated) after the end of the RF excitation pulse and can compensate for a phase dispersion along the slice following the slice excitation gradient. In general, the isodelay point in time coincides with a maximum value of the RF excitation pulse, thus in good approximation with the middle of the RF pulse given what are known as symmetrical SINC pulses.

The manipulation of the transverse magnetization can, for example, mean: excitation of the transverse magnetization via an RF excitation pulse, or refocusing of the transverse magnetization via a refocusing pulse. For example, the excitation of the transverse magnetization can take place by activating pulses known as $\alpha$ pulses, which deflect the longitudinal magnetization only partially, thus by an angle $\alpha<90°$.

For example, the readout of the second gradient echo can concern the transverse magnetization manipulated by the radiated RF pulse, thus follow the same RF pulse that has also manipulated the transverse magnetization that is read out within the scope of the first gradient echo. In other words: a k-space line can be scanned after an RF pulse. In various embodiments, it can also be possible to read out data for a defined k-space line after different RF pulses, thus with regard to transverse magnetization manipulated by at least two RF pulses.

The at least two k-space segments can overlap in part or can be disjoint, meaning that they have no k-space points in common. It is possible that at least one k-space segment includes a k-space center at which k=0 applies.

In the preceding, techniques were discussed predominantly with regard to two gradient echoes. However, it is also possible to detect a greater number of gradient echoes following the radiated RF pulse for the respective k-space line.

In other words: given the discussed multi-echo MR measurement sequence, a train of at least two gradient echoes for each k-space line can be formed following the associated RF pulse and the phase encoding.

It can be unnecessary to fill all or multiple k-space lines of each k-space segment immediately following a single RF pulse. Rather, according to the presently discussed aspect the first and second gradient echo can be detected first for each k-space line before proceeding to the next k-space line, for example by new radiation of an RF pulse and possibly new phase encoding. The k-space lines of a k-space segment can thus be each traversed multiple times following a single RF pulse to read out gradient echoes at different echo points in time or to acquire MR data with different echo times.

The gradient fields of the switched gradient pulses produce a dephasing or rephasing of a phase transition of the transverse magnetization. Gradient pulses can typically be trapezoidal, with an afferent ramp (edge) while the one amplitude of the gradient fields rises linearly, an extreme value (flat top) at which a gradient field assumes a constant amplitude, and an abducent ramp at which the amplitude of the gradient field likewise linearly declines. The gradient fields can have positive or negative amplitudes. The detection of the respective first and second gradient echo can take place during a defined time interval (readout time) around the forming gradient echo, for example. The scanning often takes place only during the flat top of the readout gradient. It is also possible to additionally also detect the first and/or second gradient echo during the ramps of the readout gradients (ramp sampling).

Readout of the gradient echoes includes demodulation of the acquired data and digitization. The MR data acquired in such a manner then exist as complex data in k-space and are therefore also designated as raw data. After further processing steps, the raw data can be transformed via Fourier transformation into image space in order to obtain the MR images.

Readout points can typically be digitized such that they have a well-defined time interval from adjacent readout points. If the gradient echo is detected only during the flat top of a readout gradient, and if they are digitized with a constant dwell time (dwell time is the time between successive readout points), a linear correlation exists between a kx-coordinate (k-space coordinate in the direction of the readout gradient field) and the readout time of a readout point relative to the echo point in time. In such a case, the acquired MR data can be transformed from k-space into image space with a fast Fourier transformation (FFT), without additional interpolation or grid normalization (regridding). Via the use of ramp sampling, a maximum achievable spatial resolution can be increased in comparison to the case without spatial scanning. However, at the same time the required computing time cost to post-process the acquired MR data can increase. Techniques for ramp sampling are known in principle to those skilled in the art, for instance from K-P. Hwang et al. "Ramp sampling strategies for high resolution single-pass Dixon imaging at 3T" in Proc. Int. Soc. Reson. Med. 15 (2010) 1044. Therefore, no additional details need to be explained here.

A gradient known as a readout pre-phasing gradient is normally activated in the readout direction before the first readout gradient. The moment of the readout pre-phasing gradient is selected such that it optimally exactly compensates the moment acquired from the first readout gradient at the desired echo point in time of the first gradient echo.

The first and second readout gradient fields can have the same polarity, such that the first detected gradient echo and the second detected gradient echo form a monopolar gradient echo pair. In this case, an additional gradient pulse can be necessary in the readout direction, which additional gradient pulse is switched between the two readout gradients and has the task of compensating as exactly as possible the phase that the spins acquire after the first gradient echo and before the second gradient echo following the two readout gradients. This gradient thus keeps the same polarity as the readout pre-phasing gradient and the opposite polarity as the two readout gradients. Alternatively, it would be possible to detect the first and second gradient echo by means of bipolar readout gradients.

A linear correlation exists between the k-space coordinate of a readout point and the accumulated 0th moment of all gradients switched in the readout direction between excitation and acquisition time of the readout point: $kx=\gamma/(2\pi)$ M0x. In particular, this moment is zero at the echo point in time, and thus so is the k-space coordinate of a readout point that is acquired symmetrically around the echo point in time.

A length of the k-space lines (and therefore a width of the respective k-space segment) is thus accordingly determined by the 0th moment of the readout gradient. The maximum amplitude of the readout gradient is typically limited depending on the system. The duration of the readout interval is often limited by the predetermined echo times and the rise time (which is limited physiologically and again depending on the design) of the gradient pulses. In such a scenario, the maximum/minimum kx coordinate or, respectively, the edge length of the k-space segments is thus in particular limited by the time interval $\Delta TE$ between the different echo points in time, or the difference between the different echo times. The duration $\Delta TE$ between the first and second echo point in time thus typically limits the readout time, and with it the length of the k-space line in the readout direction due to the limited maximum gradient amplitude. This in turn limits the resolution of the MR images.

Various embodiments are based on the idea that multiple k-space segments that respectively have lower resolution along one side of the k-space segment than along the other side of k-space segment can be combined into a complete MR data set in k-space, from which an isotropically high resolution MR image can be calculated. The per-segment scanning of k-space is achieved in different embodiments so that the maximum achievable spatial resolution is not bounded by the limited length of the individual k-space lines of the different k-space segments. Rather, via the acquisition of MR data for multiple k-space segments, k-space can be scanned in a larger region than is conventionally the case (in which it would not be possible to scan for multiple k-space segments).

Therefore, the effect of a relatively high spatial resolution of the MR images can be achieved given different echo times. At the same time, a high insensitivity to movement is achieved, since all echoes that are required to detect the different contrasts are formed after one RF excitation pulse.

Furthermore, the method can include the determination of a respective MR image from the gradient echoes of the at least two k-space segments that are acquired at the same echo times. The determination of the respective one MR image can take place by means of techniques that are selected from the following group: regridding in k-space; density compensation in k-space; successive shear operation in k-space; parallel imaging techniques, in particular Generalized Autocalibrating Partially Parallel Acquisition (GRAPPA) and Sensitivity Encoding (SENSE); for each echo time, combination of multiple MR images that are respectively acquired for each scanned k-space segment to determine an MR image; for each echo time, combination of multiple MR data that are respectively acquired for each scanned k-space segment into combined MR data from which the MR image is determined.

"At the same echo times" thus means: corresponding echo points in time, respectively relative to different RF pulses.

For example, the method according to the presently discussed aspect can include the readout of at least one third gradient echo during the application of at least one third readout gradient field, wherein the at least one third gradient echo is respectively read out in a time interval around the third echo point in time, wherein the at least one third echo point in time follows the first echo point in time and the second echo point in time.

It would thus be possible to detect a correspondingly larger number of gradient echoes following the RF pulse for each k-space line. In other words: following the RF pulse, a k-space line could accordingly be scanned more often before moving on to the next k-space line. A correspondingly larger number of MR images could thereby be obtained, respectively at different echo times or, respectively, with different contrasts. For various applications, this can be unnecessary; for example, a precision can thus be increased in a quantitative determination of defined MR parameters, for example for separation of different spin species such as water and fat. Multiple parameters can be considered, for example the multispectral nature of fat. It can also be possible to separate a larger number of spin species.

In the above, properties of the multi-echo MR measurement sequence that have been discussed with regard to one k-space line. In the following, properties are discussed that discussed with regard to k-space segments that each include multiple k-space lines.

In multiple scenarios, the at least two k-space segments are rectangular. In such embodiments, the long side of the at least two k-space segments is oriented orthogonal to the k-space lines and along a direction of the respective k-space segment that is defined by the phase encoding gradient field.

Various embodiments are based on the realization that the edge length of a k-space segment in the phase encoding direction is typically limited by the first or, respectively, shortest echo time TE1. In the relevant applications, this limitation is normally smaller than the limitation of the edge length in the readout direction. This means that the maximum length of the edge of the k-space segment in the phase encoding direction is greater than the maximum length of the edge of the k-space segment in the readout direction. If the MR data of such a rectangular k-space segment are transformed into image space, MR images are obtained that are thus of higher resolution in the phase encoding direction than in the readout direction.

An inherently high resolution along the direction ky (defined by phase encoding gradient field) can be achieved via the detection of the first and second gradient echoes for a plurality of k-space lines. In one embodiment of the invention, a comparably high resolution along the direction kx can also be achieved via the per-segment scanning of k-space in multiple k-space segments that are offset from one another along the direction kx defined by the readout gradient field.

After superposition of the MR data of the k-space segments that are respectively associated with the same echo time, and transformation into image space, in the cited embodiment MR images are thus obtained whose resolution in the readout direction is not limited by the time interval between the different echo points in time ΔTE.

In one embodiment of the invention, the at least two k-space segments all include a k-space center and the k-space segments are rotated opposite one another in a plane defined by a slice selection gradient field (for example around the k-space center).

For example, it is possible that at least two k-space segments are rotated around the k-space center or around a k-space point that is close to the k-space center. For example, such techniques are known as what are known as PROPELLER measurement techniques. In contrast to conventional PROPELLER techniques—in which a long side of the k-space segments is oriented parallel to a direction kx defined by the readout gradient field—it can be possible to associate defined features of the present aspect of the present invention with the class of what are known as short axis PROPELLER techniques from U.S. Pat. No. 7,535,222.

By the rotation of the different k-space segments counter to one another, for example around the k-space center in the kx/ky plane, the spatially high resolution phase encoding gradient field direction ky (as described above) applies to different k-space segments in different k-space directions. For example, after the acquisition of the MR data for all k-space segments it can be possible to determine for each k-space segment a number of MR images, respectively for the different echo points in time for which gradient echoes are detected. These MR images can be rotated counter to one another because the underlying k-space segments are rotated counter to one another. The different MR images are respectively of high spatial resolution along the direction ky (which varies for the different k-space segments) defined by the respective phase encoding gradient field. The different MR images are simultaneously of low resolution along the direction kx (which also varies accordingly for the different k-space segments) defined by the respective readout gradient field.

Techniques are known that allow the MR data or MR images that are acquired at defined echo times for k-space segments rotating counter to one another to be superimposed into a single, high-resolution MR image. For example, see in this regard the Patent Document DE 10 2005 046 732 B4. From the preceding explanations it is clear that the maximum achievable spatial resolution of the ultimate MR image is not bounded by the limited length of each k-space line of each k-space segment. Rather, an increased spatial resolution can be achieved via the combination of the acquired MR data of the different k-space segments, in particular in comparison to the case in which the MR data are not acquired for different k-space segments.

It is possible to scan a different number of k-space segments. In general, a greater number (smaller number) of scanned k-space segments can enable a higher (lower) spatial resolution of the respective determined MR images; at the same time, the measurement duration can be longer (shorter).

For example, it is possible that two k-space segments are scanned that are rotated opposite one another around the k-space center in the plane defined by the slice selection gradient field, and offset from one another by an angle of approximately 90°.

In other words, it is possible that the corresponding sides of the two k-space segments are orthogonal to one another. "Approximately 90°" means that a smaller angle error (for example due to engineering) causes a deviation relative to exactly 90°. In other words, "approximately 90°" can encompass: 90°±10°, or preferably 90°±5°, or more preferably 90°±1°.

If only two k-space segments are scanned, a density of the sample points (for example in peripheral k-space regions) can thus fall below a sampling density required according to the Nyquist theorem. However, a quality loss of the corresponding MR image can turn out to be quantitatively small and be tolerable for subsequent applications. Therefore, given the scanning of only two k-space segments a particularly short measurement duration can be achieved, wherein at the same time a comparably high image quality of the defined MR images can be ensured.

In the preceding, techniques have been described in which a rotation of the different k-space segments takes place around a defined point, for example the k-space center. As an alternative or in addition to the rotation described above, a shift of the different scanned k-space segments counter to one another can also occur.

For example, it is possible for the at least two k-space segments to be shifted counter to one another, essentially parallel to the short side of the at least two k-space segments in a plane defined by a slice selection gradient field.

The shift being essentially parallel to the short side means that the component of the shift that is parallel to the short side predominates.

For example, it is possible that only a shift of the at least two k-space segments counter to one another occurs, and that simultaneously no or only a slight rotation of the at least two k-space segments counter to one another occurs. It can hereby be particularly desirable to implement the shift of the at least two k-space segments essentially parallel to the short side of the k-space segments since the resolution of the MR images can be comparably significantly increased in such a manner. For example, the shift can take place along the direction kx defined by the readout gradient field.

In the preceding, techniques have predominantly been described in which a rotation and/or shift of the at least two k-space segments occurs within the plane defined by the slice selection gradient field. In other words: such techniques concern a slice-specific or, respectively, two-dimensional (2D) scanning of k-space. However, it is also possible to implement a three-dimensional (3D) scanning of k-space, for example via a rotation and/or displacement and/or tilting of the at least two k-space segments around and along a direction that is orthogonal to the respective plane spanned by the at least two k-space segments.

For example, the at least two k-space segments can all include a k-space center, wherein the at least two k-space segments are rotated counter to one another around the k-space center so that a sphere in k-space is scanned.

For example, the scanning of the 3D sphere in k-space can take place via a simultaneous rotation and tilting of the individual k-space segments counter to one another. For example, a radius of the sphere can be defined by the long side of each k-space segment, which can be situated parallel to the direction ky defined by the respective phase encoding gradient field.

The efficiency of such a 3D variant can be limited in the central region of k-space due to an oversampling, thus a comparably high density of acquired MR data. In spite of this, corresponding techniques can be unnecessary, in particular when the duration for the detection of gradient echoes per k-space segment should be short. This can be the case if a movement of the examined person is present (for instance due to breathing, etc.).

In the preceding, techniques have predominantly been described in which the resolution of the k-space segments along the direction kz (defined by the slice selection gradient field) can be determined by the width of the excited slice. In other words: techniques have been described in which the individual k-space segments are acquired with what are known as 2D sequence techniques. Alternatively or additionally, it is possible for the k-space segments themselves to be three-dimensional.

A first three-dimensional (3D) variant of the sequence according to the invention includes switching of a second phase encoding table along the slice selection direction. Each k-space segment can then be a cuboid in k-space. Each of these cuboids is scanned in a three-dimensional grid in different embodiments.

The at least two k-space segments are thus cuboid in different embodiments, wherein each of the at least two k-space segments respectively comprises multiple rectangular sub-segments which, via application of an additional phase encoding gradient field, are shifted counter to one another along the direction defined by a slice selection gradient field. A long side of the multiple sub-segments can be oriented along a direction that is defined by the phase encoding gradient field or by the additional phase encoding gradient field. A short side of the multiple sub-segments can be oriented along a direction of the respective k-space segment that is defined by the readout gradient field.

In other words: the sub-segments can have only two dimensions, but by the use of multiple sub-segments per k-space segment, the k-space segment can have three dimensions. The sub-segments can have properties as described in the preceding with regard to the k-space segments.

In other words: it can be possible to switch a second phase encoding table along a direction kz defined by the slice selection gradient field. Each k-space segment can thus be a 3D cuboid in k-space. These cuboid k-space segments can be scanned in a 3D grid.

Corresponding to the techniques discussed in the preceding with regard to 2D k-space segments, it can be possible to rotate and/or displace and/or tilt the different 3D k-space segments counter to one another in k-space.

For example, it can be possible that the at least two k-space segments all include a k-space center, wherein the k-space segments are rotated counter to one another in a plane defined by the respective readout gradient field and a plane defined by the phase encoding gradient field or the additional phase encoding gradient field.

It is also possible that the at least two k-space segments all include a k-space center and are rotated counter to one another around the k-space center such that a cylinder or a sphere in k-space is scanned. In other words: a rotation around multiple rotation axes and/or a rotation center can thus take place.

In the preceding, techniques have predominantly been described which concern a relative arrangement and/or orientation of the at least two k-space segments relative to one another, both in 2D and in 3D. In the following, techniques are described that concern the detection of the gradient echoes or, respectively, the acquisition of MR data for each of the at least two k-space segments.

It is possible that the detection of the gradient echoes takes place within the scope of a spin echo/gradient echo hybrid sequence. For example, a spin echo can be refocused by means of a spin echo sequence, and the first and second gradient echoes are detected in proximity to the spin echo.

Spin echo/gradient echo hybrid sequences are known in principle to those skilled in the art, for example with regard to what are known as gradient and spin echo (GRASE) MR measurement sequences or, respectively, turbo gradient spin echo (TGSE) MR measurement sequences.

For example, it is possible that the RF pulse is a refocusing pulse to generate a spin echo of the transverse magnetization, wherein the first echo point in time and the second echo point in time lie within the time period of the spin echo. In such a case, the echo time is typically given as a time between the spin echo and the echo point in time.

In one embodiment, a spin echo is refocused with a spin echo (SE) sequence, and the train of gradient echoes forms in proximity to the spin echo.

In a hybrid sequence similar to GRASE/TGSE, the train of gradient echoes is formed repeatedly, respectively in proximity to the multiple spin echoes generated with a train of refocusing pulses. The phase encoding gradients are thereby preferably varied between individual spin echoes so that different k-space lines of a segment are scanned in one echo train.

In different embodiments, the refocusing pulse can be part of a series of multiple refocusing pulses that follow an RF excitation pulse to excite the transverse magnetization. After one refocusing pulse of the series of multiple refocusing pulses, at least one of the k-space lines of each of the at least two k-space segments can respectively be scanned.

In other words, it can be possible to vary the phase encoding gradient field between the individual spin echoes that are generated by the refocusing pulses so that different k-space lines of one k-space segment are scanned within the framework of a train of spin echoes after the single RF excitation pulse. Multiple gradient echoes can be detected for each spin echo. For example, it is possible that all k-space lines of a k-space segment are detected after a single RF excitation pulse, i.e. within a single spin echo train.

Problems that arise from patient movement can be reduced by employing such techniques that use spin echo/gradient echo hybrid sequences. The duration of a spin echo train is normally so short that a movement that occurs during the acquisition of the MR data for a k-space segment can be "frozen". The remaining movement of the examined person that occurs between the acquisition of the MR data of different k-space segments can be corrected or, respectively, reduced by means of techniques as they are known from conventional PROPELLER MR imaging. For example, this can take place by a corresponding weighting of the acquired MR data of the different k-space segments. Unwanted image artifacts due to movements of the examined person can be reduced in such a manner.

In various embodiments, successive gradient echoes are read out during the application of readout gradient fields with different polarity.

The first detected gradient echo and the second detected gradient echo can thus optionally be formed with a bipolar gradient scheme, meaning that the readout gradient fields switched during the acquisition of successive echoes have opposite polarity.

It is also possible to use a monopolar readout scheme. Given such a monopolar readout scheme, successive readout gradients have the same polarity. Given such a readout scheme, between the readout intervals it is normally necessary to switch an additional gradient with opposite polarity in the readout direction, which additional gradient compensates the phase which the spins acquire as a result of the first readout gradient after the first gradient echo and as a result of the second readout gradient before the second gradient echo. For a given echo time difference $\Delta TE$, the duration of this additional gradient shortens the time provided for readout of the echoes, and therefore shortens the maximum edge length of the individual segment in the readout direction. The bipolar scheme is thus typically more efficient, but the monopolar scheme has other advantages. For example, spin species with different resonance frequencies are shifted in the same direction in successive contrasts. In contrast to this, given the bipolar readout scheme the shift direction is inverted, which can cause difficulties in post-processing methods (such as Dixon).

According to a further aspect, the invention concerns an MR system that is set up to determine multiple MR images of an examination subject for respective different echo points in time by means of a multi-echo MR measurement sequence. The multi-echo MR measurement sequence scans k-space per segment with at least two k-space segments. The at least two k-space segments are scanned line-by-line along k-space lines. For each k-space line, the multi-echo MR measurement sequence forms a first gradient echo at a first echo point in time and a second gradient echo at a second echo point in time. The MR system has an RF transmission unit which is set up to radiate an RF pulse to manipulate a transverse magnetization. Furthermore, the MR system has a gradient system which is set up in order to apply a phase encoding gradient field for phase encoding of a current k-space line. The MR system furthermore has an RF receiver system which is designed to implement the following steps: readout of the first gradient echo of the transverse magnetization manipulated by the radiated RF pulse for the current k-space line during the application of a first readout gradient field, wherein the first gradient echo is detected in a time interval around the first echo point in time; and readout of the second gradient echo during the application of a second readout gradient field, wherein the second gradient echo is detected in a time interval around the second echo point in time. The at least two k-space segments are rectangular, wherein a long side of the at least two k-space segments is oriented along a direction of the respective k-space segment that is defined by the phase encoding gradient field. A short side of the at least two k-space segments is oriented along a direction of the respective k-space segment that is defined by the readout gradient field.

For such an MR system, effects can be achieved that are comparable to the effects that can be achieved for the method to determine an MR image according to a further aspect of the present invention.

It is possible that the MR system is set up according to the presently discussed aspect in order to implement the method to determine an MR image according to a further aspect of the present invention.

The features presented above and features that are described in the following can be used not only in the corresponding, explicitly presented combination, but also in additional combinations or in isolation, without departing the scope of the present invention.

BRIEF DESCRIPTION OF THE DRAWINGS

FIG. 10 depicts a sequence scheme for the detection of gradient echoes for a 3D k-space segment.

FIG. 11A depicts a sphere in k-space that is scanned via rotation and/or tilting of 3D k-space segments.

DESCRIPTION OF THE PREFERRED EMBODIMENTS

Figure 1:
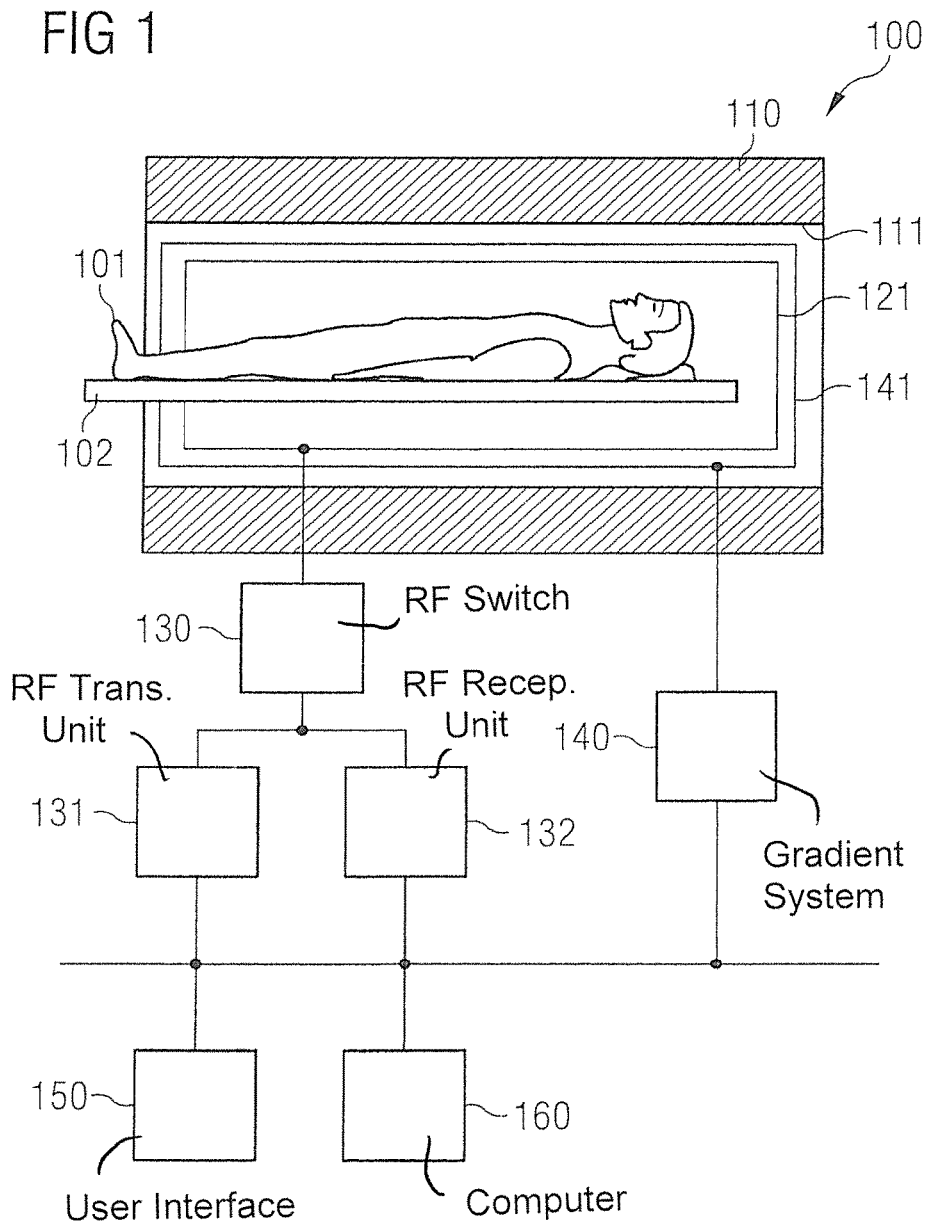
FIG. 1 schematically illustrates of an MR system constructed and operating in accordance with the invention.

In the following, the present invention is explained in detail using preferred embodiments with reference to the figures wherein identical reference characters denote identical or similar elements.

In the figures, techniques are explained that relate to a mufti-echo MR measurement (data acquisition) sequence in which gradient echoes are respectively formed for different echo points in time and MR images are determined based on the read-out gradient echoes. For example, by means of such MR images it can be possible to implement what is known as chemical shift imaging, thus for instance a separation of different spin species using the MR images that exhibit contrasts for the different echo points in time or, respectively, echo times.

In particular, the techniques described in the following are characterized in that corresponding k-space lines of different contrasts are acquired at short time intervals, which enables a comparably high insensitivity to movement. In contrast to the n-echo per TR techniques known from the prior art, they simultaneously enable a higher isotropic resolution of the determined MR images. This occurs via the scanning of k-space with multiple k-space segments whose short side is respectively oriented along the k-space lines or, respectively, the direction kx defined by the respective readout gradient field. By scanning a large number of parallel k-space lines per k-space segment, a high resolution can inherently be achieved in the direction ky defined by the respective phase encoding gradient field. Via the combination of the MR data of multiple k-space segments that are shifted and/or rotated counter to one another, it is achieved that the MR images calculated from the superimposed data set are of high isotropic resolution.

In FIG. 1, an MR system 100 is shown that is designed to implement techniques, methods and steps according to the invention. The MR system 100 has a magnet 110 that defines a tube 111. The magnet 110 can generate a basic magnetic field parallel to its longitudinal axis. An examination subject (here an examined person 101) on a bed table 102 can be slid into the magnet 110. The MR system 100 furthermore has a gradient system 140 to generate gradient fields that are used for MR imaging and for spatial encoding of acquired raw data. The gradient system 140 typically comprises at least three gradient coils 141 that can be controlled separately and positioned in a well-defined manner relative to one another. The gradient coils 141 enable gradient fields to be applied and switched along defined spatial directions (gradient axes). The corresponding gradient coils 141 are also designated as channels of the gradient system 140. A machine coordinate system of the MR system 100 can be defined by the windings of the gradient coils 141. The gradient fields can be used for slice selection, for frequency encoding (in the readout direction) and for phase encoding, for example. A spatial encoding of the raw data can thereby be achieved.

The spatial directions (which are respectively parallel to slice selection gradient fields, phase encoding gradient fields and readout gradient fields) do not necessarily need to be coincident with the machine coordinate system. Rather, they can, for example, be defined in relation to a k-space trajectory which can in turn be established on the basis of specific requirements of the respective MR measurement sequence and/or be established based on anatomical properties of the examined person 101.

An RF coil arrangement 121 that can radiate an amplitude-modulated RF excitation pulse into the examined person 101 is provided for excitation of the polarization resulting in the basic magnetic field or, respectively, alignment of the magnetization in the longitudinal direction. A transverse magnetization can thereby be generated. To generate such RF excitation pulses, an RF transmission unit 131 is connected via an RF switch 130 with the RF coil arrangement 121. The RF transmission unit 131 can comprise an RF generator and an RF amplitude modulation unit. The RF excitation pulses can flip the transverse magnetization slice-selectively in 1d or spatially selectively in 2D/3D, or globally, out of the steady state.

Furthermore, an RF reception unit 132 is coupled via the RF switch 130 with the RF coil arrangement 121. MR signals of the relaxing transverse magnetization can be acquired via the RF reception unit 132 as raw data, for example via inductive injection into the RF coil arrangement 121.

In general, it is possible to use separate RF coil arrangements 121 for the radiation of the RF excitation pulses by means of the RF transmission unit 131 and for the acquisition of the raw data by means of the RF reception unit 132. For example, a volume coil 121 can be used for the radiation of RF pulses and a surface coil (not shown) which comprises an array of RF coils can be used for the acquisition of raw data. For example, the surface coil for the acquisition of the raw data can comprise 32 individual RF coils and can therefore be particularly suitable for partially parallel imaging. Corresponding techniques are known to those skilled in the art, such that here no additional details need to be explained.

The MR system 100 furthermore has a computer 160. For example, the computer 160 can be set up in order to control the acquisition of MR data within the scope of a multi-echo MR measurement sequence initiated via a user interface 150. Furthermore, the computer can be set up in order to implement a transformation of MR data from k-space into image space to determine an MR image. The computer can furthermore be set up to superimpose acquired MR data for the multiple k-space segments to determine the MR image.

The use of the multi-echo MR measurement sequence means that, for the same k-space points or k-space regions, MR data are respectively acquired at different echo points in time, for example relative to an RF pulse that manipulates the transverse magnetization. Such a scenario is depicted in FIG. 2.

Figure 2:
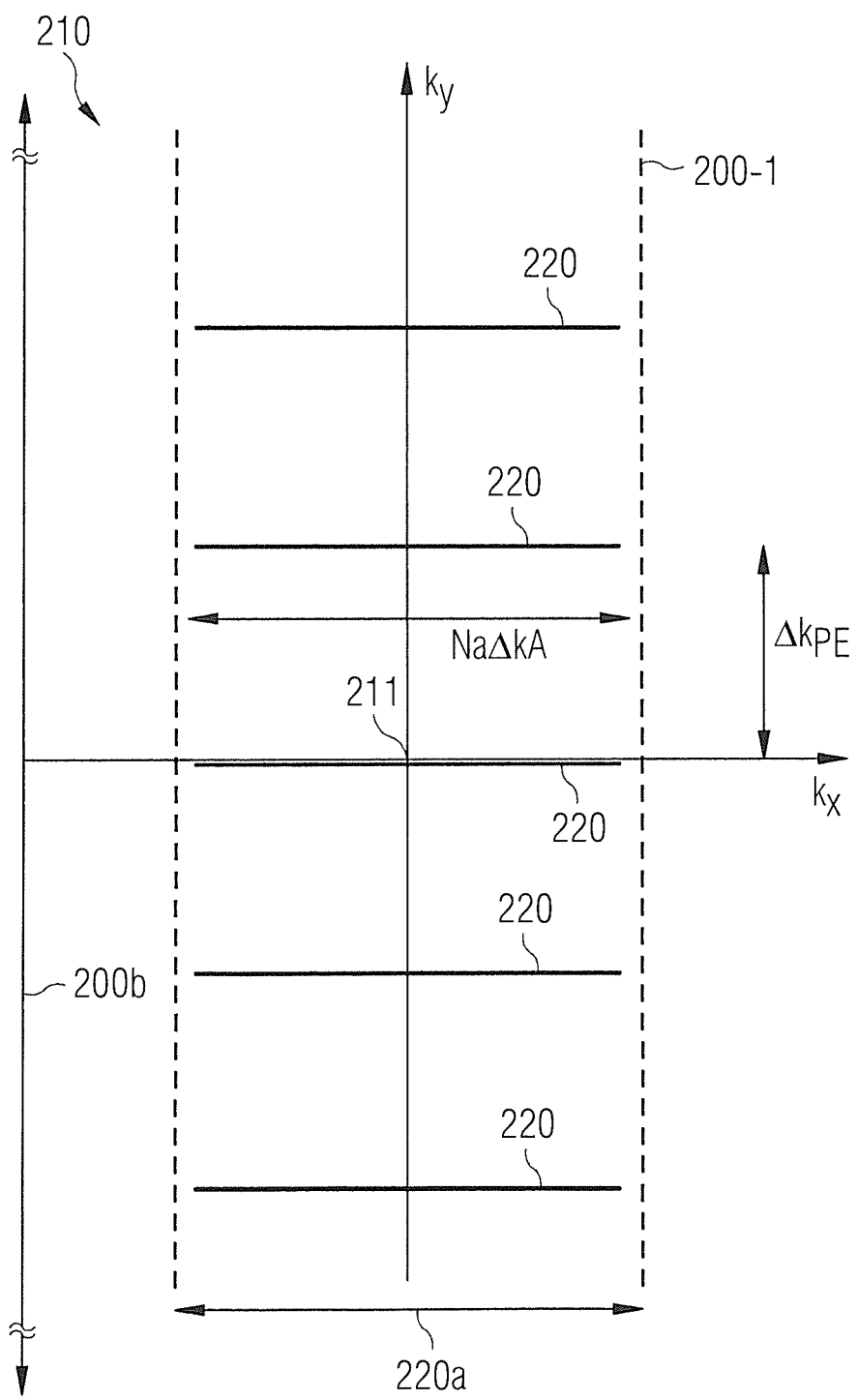
FIG. 2 illustrates a k-space segment in accordance with the invention.

A single k-space segment 200-1 of k-space 210 is scanned by entering raw (acquired MR data therein along multiple k-space lines 220 of the segment 200-1 as shown in FIG. 2. The direction kx (horizontal axis in FIG. 2) is parallel to the direction of the readout gradient field of the k-space segment 200-1. Orthogonal to this is the direction ky, which is oriented parallel to the direction of the phase encoding gradient field of the k-space segment 200-1. The k-space center 211 is located at the origin of the kx and ky coordinates. At the k-space center 211, kx=0 and ky=0.

The spacing between adjacent k-space lines 220 amounts to $\Delta k_{pe}$. The length of the k-space lines 220 amounts to $Na\Delta ka$, wherein Na is the number of readout points and $\Delta ka$ is the spacing between adjacent readout points, which is constant in the example of FIG. 2. As is clear from FIG. 2, the length of the k-space lines 229 determines the width 200a of the k-space segment 200-1. As is shown in the following, the length of the k-space lines 200 is limited by the necessity to detect gradient echoes for different and predetermined echo times or, respectively, echo points in time. The extent of the k-space segment in the phase encoding direction NPE*$\Delta$kPE (where NPE is the number of phase encoding steps) is subject to other limitations. For the applications relevant here, these limitations are normally smaller. This means that the extent in the phase encoding direction can be chosen to be greater than the extent in the readout direction.

Therefore, the k-space segment 200-1 is rectangular, with the long side 200b of the k-space segment 200-1 oriented orthogonal to the k-space lines 220 and along the phase encoding direction ky. The short side 200a of the k-space segment 200-1 is oriented along the k-space lines 220 and along the readout direction kx.

An inherently high resolution can therefore be provided along ky by scanning a correspondingly large number of k-space lines 220. Due to the limited width 200a of the k-space segment 200-1, the resolution in the kx direction is initially limited; however, this limited resolution in the kx direction can be corrected according to the invention via the acquisition of MR data for multiple k-space segments (not shown in FIG. 2).

Figure 3:
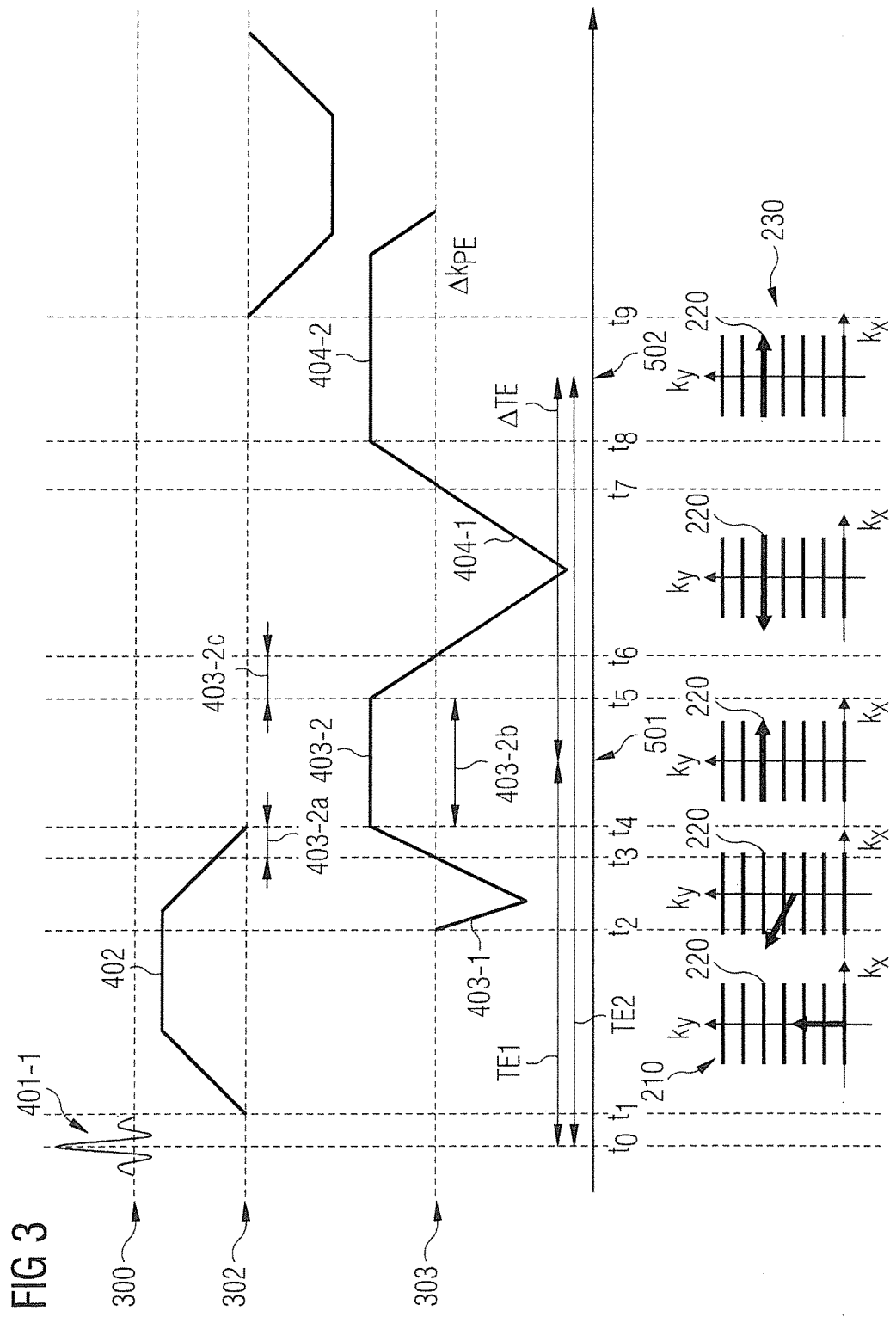
FIG. 3 shows a sequence for a k-space line of FIG. 2 according to different embodiments.

A simplified sequence scheme for a single k-space line 220 is depicted in FIG. 3. The radio-frequency signal 300 is depicted at the top in FIG. 3. The radiation of an RF pulse 401-1 takes place first. For clarity, the application of a slice selection gradient field is not shown in FIG. 2. The RF pulse 401-1 excites the transverse magnetization (RF excitation pulse), i.e. it deflects the longitudinal magnetization of the nuclear spins at least partially out of a steady state produced by the basic magnetic field.

The application of a phase encoding gradient field 402 along the phase encoding direction 302 subsequently takes place. In FIG. 3, the k-space line 220 is scanned twice (double echo gradient echo sequence). For this purpose, a first readout pre-phasing gradient 403-1 is initially switched (activated) along the readout direction 303. The object of the readout pre-phasing gradient 403-1 is to compensate as precisely as possible (by virtue of is gradient moment) for the phase that the spins will acquire as a result of a readout gradient 403-2 activated around the desired first echo point in time 501 (corresponding to duration TE1) of the first gradient echo. The first readout gradient 403-2 is subsequently switched for frequency-encoding of the transverse magnetization. The readout gradient 404-2 forms the second gradient echo at the second echo point in time 502 (corresponding to duration TE2). Since both readout gradients 403-2, 404-2 have the same polarity (monopolar readout scheme) in the shown example, an additional gradient 404-1 is switched between the readout gradients 403-2, 404-2, the moment of which additional gradient 404-1 is chosen such that it compensates the phase which the pins acquire as a result of the first readout gradient 403-2 after the first echo time TE1 and before the second echo time TE2 as a result of the second readout gradient 404-2.

At the bottom of FIG. 3, the k-space trajectory 230 during selected time intervals is illustrated by a thickened arrow. As can be seen from FIG. 3, the k-space line 220 is scanned from left to right during the readout gradients 403-2 and 404-2.

Furthermore, time periods of the rising edge 403-2a, the falling edge 403-2c and the flattop 403-2b are depicted for the readout gradient 403-2 in FIG. 3. If data are read out during the complete duration 403-2b, the length of the k-space line 220 correlates with the moment of the readout gradient 403-2 during the time interval 403-2b. The greater this moment, the greater a spatial resolution that can be achieved for the MR data acquired for the k-space line 220. By means of specific techniques, it is also possible to acquire MR data for the edges 403-2a, 403-2c. The spatial resolution can thereby be additionally increased.

Figure 4:
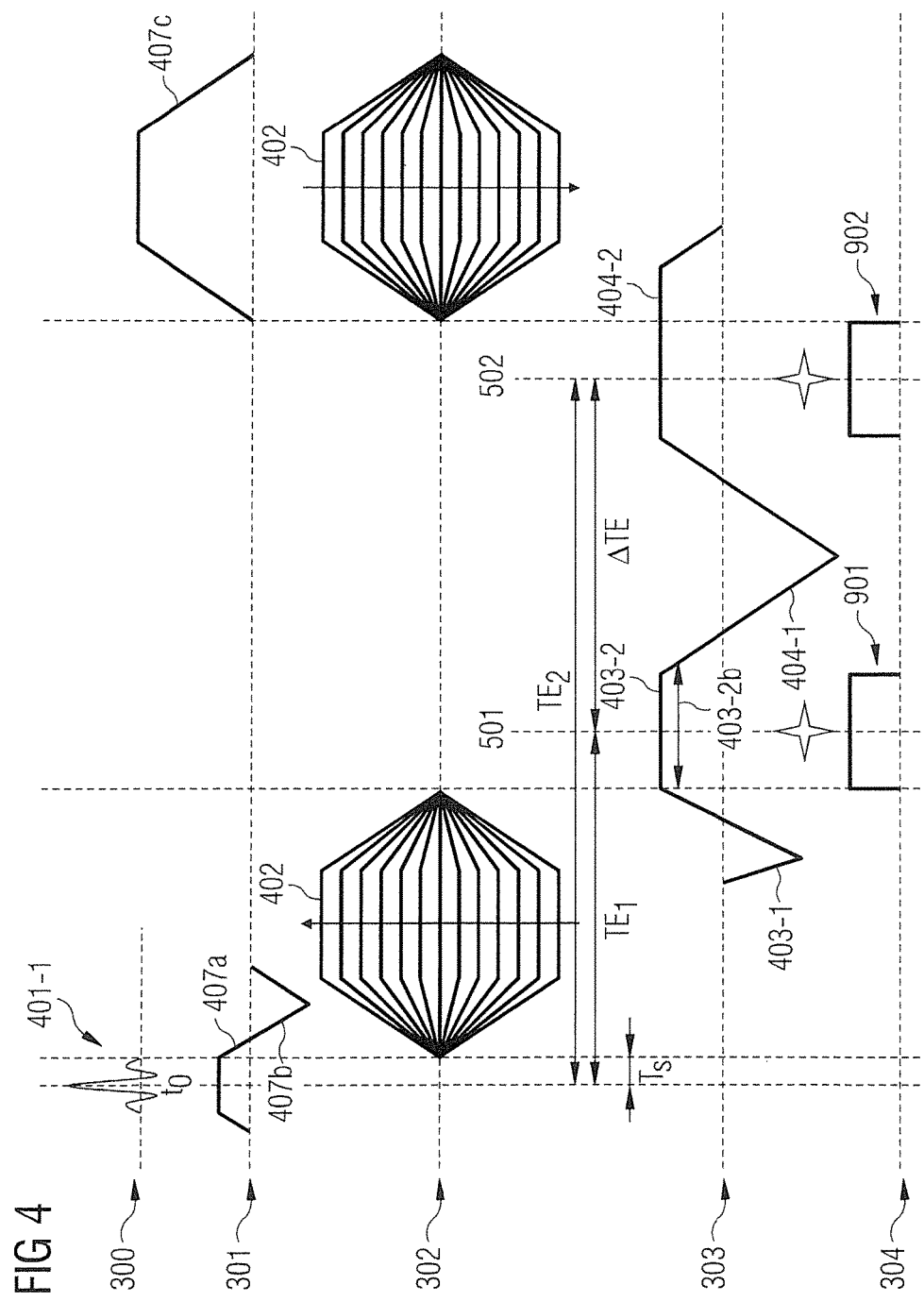
FIG. 4 shows a sequence with monopolar readout gradients according to different embodiments.

The sequence scheme of FIG. 3 is presented in greater detail in FIG. 4 for multiple k-space lines 220. In particular, in FIG. 4 a first echo point in time 501 at which the first gradient echo is formed and a second echo point in time 502 at which the second gradient echo is formed are depicted. Time intervals 901, 902 are also depicted in which the gradient echoes are read out. A gradient echo always forms at those times t at which it applies for the entire accumulated zeroth gradient moment:

$$m_i(t) = \int_{t0}^{t} G_i(\tilde{t}) d\tilde{t} = 0; i = R, S, \quad (1)$$

where R, S respectively designate the readout direction 303 and the slice selection direction 301. The start of integration $t_0$ is what is known as the isodelay point in time of the RF pulse 401-1, which coincides in good approximately with the temporal middle of the RF pulse 401-1 given symmetrical, sinc-shaped RF pulses.

In FIG. 4, three gradients 407a, 407b and 407c are switched in the slice selection direction 301. 407a is the slice selection gradient that is switched during the RF radiation. Gradient 407b has the task of compensating for the phase that the spins have accumulated as a result of the slice selection gradient. With regard to Equation 1: the moment in the slice selection direction that is accumulated between the isodelay time of the RF pulse and the end of the slice selection gradient field 407a is compensated by the slice selection gradient field 407b (slice refocusing gradient) so that $m_s(t)=0$ for all times t between the end of the slice selection gradient field 407b and the beginning of a spoiler slice selection gradient field 407c (slice spoiling gradient).

In the readout gradient field direction kx, the moment of the readout pre-phasing gradient 403-1 is selected such that it compensates for the moment acquired by the readout gradient field 403-2 at the desired first echo point in time 501.

In the example of FIG. 4, the readout gradients 403-2, 404-2 have the same polarity and the same amplitudes. This selection is not mandatory, but can have advantageous effects given a later reconstruction of the MR image, for example since the shift between fat MR image and water MR image that are respectively obtained for the first echo point in time 501 or, respectively, the second echo point in time 502 is the same in the readout direction 303.

It is also possible that the flattop duration of the readout gradient echoes 403-2, 404-2 is of identical length. For a readout channel 304, the time intervals 901, 902 are respectively illustrated for which gradient echoes are detected and converted from analog to digital in order to obtain sample points of the acquired MR data.

The first echo point in time 501 is defined with regard to the isodelay point in time t0 (labeled with the echo time TE1 in FIG. 4). The second echo point in time 502 is accordingly defined with regard to the isodelay point in time t0 (labeled with the echo time TE2 in FIG. 4). The time difference between the first and second echo point in time 501, 502 is designated with ΔTE. This time period also corresponds to the difference between the echo times TE1, TE2.

Figure 5:
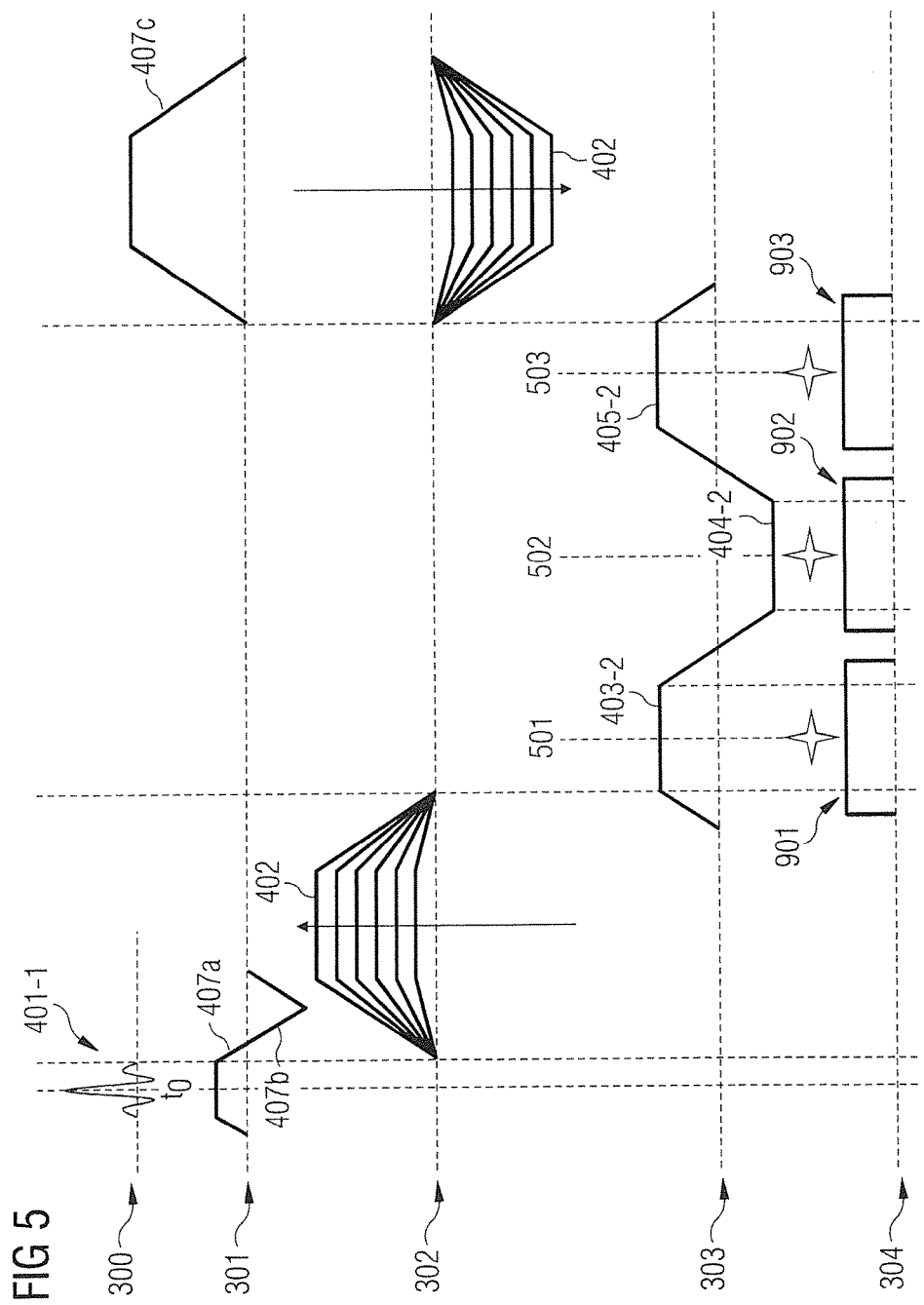
FIG. 5 shows a sequence with three bipolar readout gradients according to different embodiments.

A sequence scheme of an alternative embodiment of a multi-echo MR measurement sequence is depicted in FIG. 5. In the sequence scheme of FIG. 5, for a k-space line 220 following the RF pulse 401-1a count of three gradient echoes is detected via application of the bipolar readout gradient fields 403-2, 404-2, 405-2 (in FIG. 5, the three gradient echoes are represented by stars). The three gradient echoes are respectively formed at the echo points in time 501, 502, 503.

While the gradient echo train comprises three gradient echoes in FIG. 5, in different embodiments it would be possible to detect only two gradient echoes or more than three gradient echoes, for example.

Furthermore, in the embodiment of FIG. 5 an acquisition of the MR data takes place at the readout channel 304 and during the ramping of the readout gradient fields 403-1, 404-1, 405-1 (ramp sampling). A relatively higher spatial resolution thus can be achieved.

Figure 6:
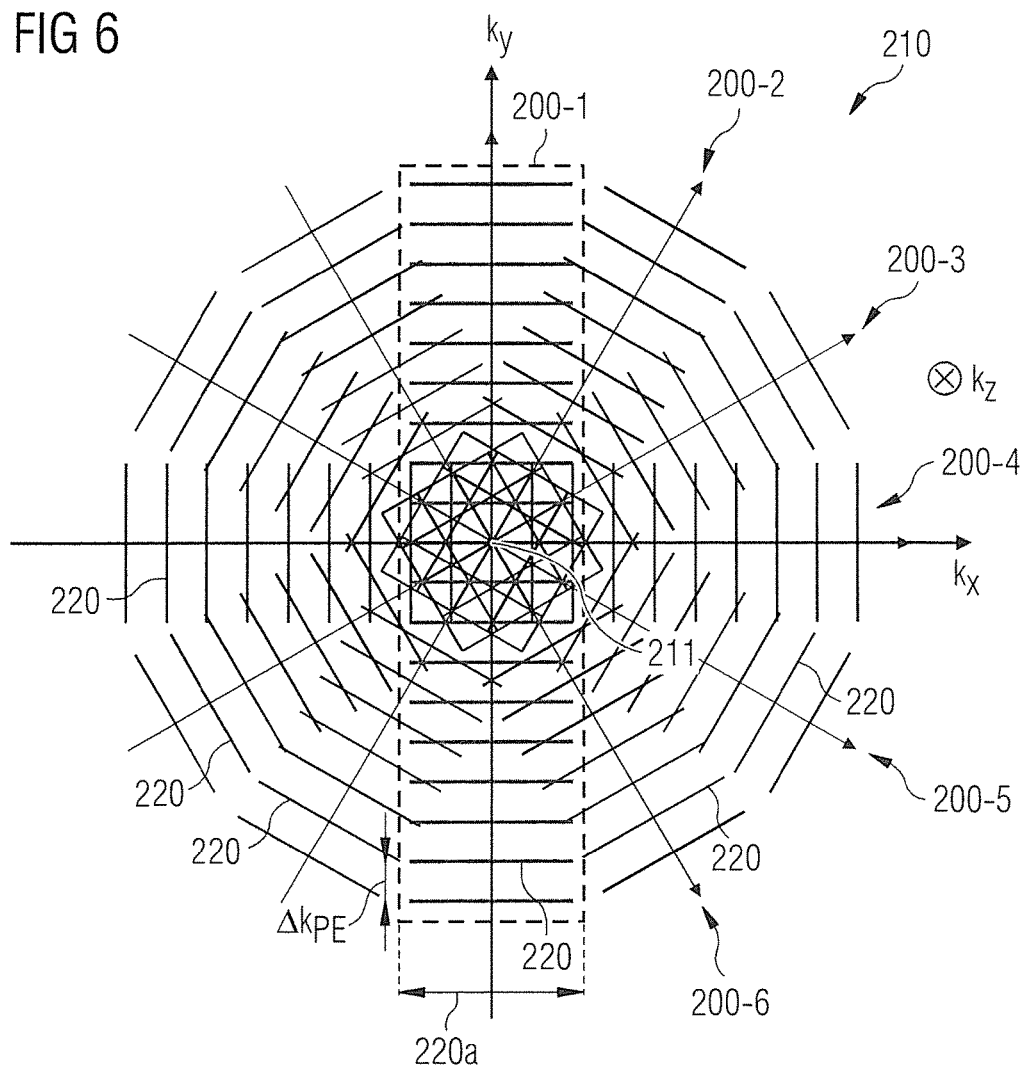
FIG. 6 depicts a short axis PROPELLER-like rotation of multiple k-space segments according to different embodiments.

A count of six k-space segments 200-1, 200-2, 200-3, 200-4, 200-5, 200-6 is depicted in FIG. 6. The k-space segment 200-1 that is discussed with regard to the preceding figures is emphasized by a dashed outline in FIG. 6. In FIG. 6, the direction kx of k-space coincides with the readout direction of the emphasized k-space segment. The same accordingly applies to the direction ky of k-space and the phase encoding direction of the marked k-space segment. The different k-space segments 200-1, 200-2, 200-3, 200-4, 200-5, 200-6 are respectively rotated by 30° relative to their neighbors and around a rotation axis including the k-space center 211, which rotation axis is parallel to a slice selection gradient field direction kz.

Such segmentation of k-space 210 is also used in the aforementioned short axis PROPELLER techniques from U.S. Pat. No. 7,535,222. In contrast to U.S. Pat. No. 7,535,222, here the lines 220 of a k-space segment (propeller blade) are not filled with an EPI trajectory after an excitation pulse. The k-space trajectory 230 for acquisition of a k-space line 220 presently respectively starts in the k-space center 211 and does not successively traverse the k-space lines (see FIG. 3 versus FIG. 1b in U.S. Pat. No. 7,535,222). Moreover, presently each k-space line 220 is traversed multiple times in immediate succession, for example, to acquire different contrasts. The goal that is present in this exemplary embodiment is also different than the goal of U.S. Pat. No. 7,535,222; the teaching there serves to reduce distortions of an echoplanar (EPI) sequence by increasing the speed with which k-space is traversed in the phase encoding direction. One effect of different embodiments of the present invention is to increase the resolution of a multi-contrast sequence at predetermined echo times.

Figure 7:
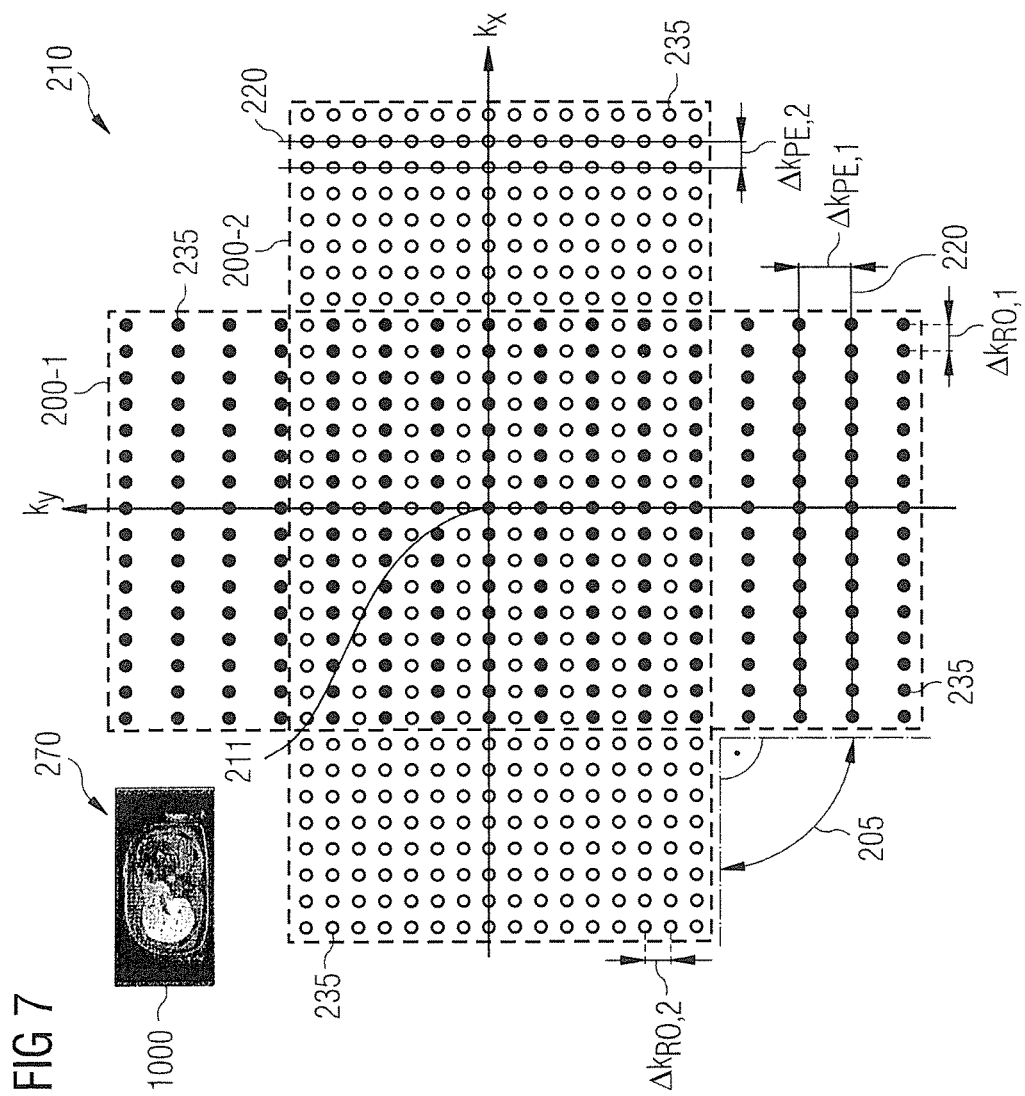
FIG. 7 depicts a short axis PROPELLER-like rotation of two k-space segments according to different embodiments.

In FIG. 7, a scenario is illustrated in which k-space 210 is scanned by two k-space segments 200-1, 200-2, wherein the two k-space segments 200-1, 200-2 are rotated counter to one another by an angle of 90° around the k-space center 211 in the plane defined by the slice selection gradient field (for example, this plane can have a normal vector or is oriented parallel to kz). In such a scenario, a particularly fast scanning of k-space 210 can take place. Furthermore, sample points 235 that are obtained by digitizing the detected gradient echoes as acquired MR data are depicted in FIG. 7.

A scanning of k-space 210 with only two k-space segments 200-1, 200-2 enables diverse effects. In the phase encoding gradient field direction ky of one of the segments 200-1, 200-2, it applies that:

$$\Delta k_{PE} = 1/\text{FoV}_{PE} = 1/(N_{PE}\Delta p_{PE}) \text{ or, respectively,}$$
$$N_{PE}\Delta k_{PE} = 1/\Delta p_{PE}, \quad (2)$$

where $\Delta p_{PE}$ is the spacing of adjacent lines in the phase encoding gradient field direction ky, and $N_{PE}$ is the number of phase encoding steps, and $\text{FoV}_{PE}$ designates the dimension of a field of view (FoV) in the phase encoding direction in image space 270 for the MR image 1000 (shown as an inset in FIG. 7).

The smaller that the FoV is chosen to be along the phase encoding gradient field direction ky, the smaller the count of the phase encoding steps $N_{PE}$ that is necessary in order to realize a desired resolution for the MR image 1000.

In Cartesian imaging, in reference implementations the phase encoding gradient field direction ky is therefore conventionally oriented along the minor [short] body axis of the examined person 101, and the actual field of view in the phase encoding gradient field direction ky (which includes phase oversampling) is chosen to the smaller than the field of view in the readout direction kx. Furthermore, in reference implementations in Cartesian imaging the resolution is often chosen to be smaller in the phase encoding gradient field direction ky than in the readout direction kx.

However, in MR imaging using the aforementioned PROPELLER techniques a non-quadratic field of view can be disproportionately more difficult to realize with conventional techniques, and the efficiency gain can typically be smaller; see in this regard P. E. Larson and D. G. Nishimura "Anisotropic Field-of views for PROPELLER MRI" in Proc. Intl. Soc. Mag. Reson. Med. 15 (2007) 1726, for instance. In one embodiment with two k-space segments 200-1, 200-2 (as is depicted in FIG. 7), however, a rectangular field of view can be comparably simple to realize and indicate a large gain in efficiency.

Based on two orthogonal directions x and y to be provided by the user; a (normally not quadratic) field of view that is specified by the extent FoVx along the x-direction and the extent FoVy along the y-direction; and a desired pixel size Δx in the x-direction or, respectively, Δy in the y-direction and a desired echo time difference ΔTE, the readout gradient field direction kx of the k-space segment 200-1 is oriented along the x-direction and the phase encoding gradient field direction of the k-space segment 200-1 is oriented along the y-direction. It applies that:

$$\text{FoV}_{PE,1} = \text{FoV}_y, \Delta p_{PE,1} = \Delta y, \text{FoV}_{RO,1} = \kappa 1 \text{FoV}_x, \Delta p_{RO,1} = \Delta x$$

wherein $\text{FoV}_{PE,1}$ designates the field of view in the phase encoding direction, and $\text{FoV}_{RO,1}$ designates the field of view in the readout direction, respectively for the first k-space segment 200-1.

The readout gradient field direction kx of the segment 200-2 is placed along the y-direction and the phase encoding gradient field direction of the second segment is placed along the x-direction, such that it applies that:

$$\text{FoV}_{PE,2} = \text{FoV}_x, \Delta p_{PE,2} = \Delta x, \text{FoV}_{RO,2} = \kappa 2 \text{FoV}_y, \Delta p_{RO,2} = \Delta y$$

wherein $\text{FoV}_{PE,2}$ designates the field of view in the phase encoding direction, and $\text{FoV}_{RO,2}$ designates the field of view in the readout direction, respectively for the second k-space segment 200-2.

The factors κ1 and κ2 are optional additional readout oversampling factors whose value can be set greater than or equal to 1. Therefore, the k-space line spacing $\Delta k_{PE,1}$, $\Delta k_{PE,2}$ in the phase encoding direction of the two respective k-space segments 200-1, 200-2 is established with Equation 2. Moreover, the number of phase encoding steps or k-space lines 220 $N_{PE,1}$ $N_{PE,2}$ is established.

The k-space spacing of two sample points in the readout direction kx is respectively defined as $\Delta k_{RO,1}$, $\Delta k_{RO,2}$ for the two k-space segments 200-1, 200-2, and is provided by:

$$\Delta k_{RO,i}/\text{FoV}_{RO,i}, i=1,2. \quad (3)$$

In contrast to known solutions, in embodiments according to the invention the number of sample points 235 in the readout direction $N_{RO,1}$) $N_{RO,2}$ is freely selectable and much smaller than the value calculated from the subsequent equation for Cartesian (or radial) imaging:

$$N_{RO,cart}\Delta k_{RO,i}=1/\Delta p_{RO,i}, i=1,2. \quad (4)$$

For the number of sample points $N_{RO}$ in the readout direction kx, it thus applies that:

$$N_{RO,i} < N_{RO,cart} = 1/(\Delta k_{RO,i}\Delta p_{RO,i}) = \text{FoV}_{RO,i}/\Delta p_{RO,i},$$
$$i=1,2 \quad (5)$$

$N_{RO,1}$ is preferably selected as large as possible so that the desired echo time difference $\Delta TE$ can still be realized between successive echo points in time. The unsampled, peripheral k-space corners can be kept as small as possible in such a manner.

A k-space grid spacing $\Delta k_x$ in the x-direction and a k-space grid spacing $\Delta k_y$ in the y-direction are subsequently established, and the ($\Delta k_{RO,1}$, $\Delta k_{PE,1}$) data matrix of the first segment with grid spacing $\Delta k_{RO,1}$ in the x-direction and $\Delta k_{PE,1}$ in the y-direction is interpolated as well as the ($\Delta k_{PE,2}$, $\Delta k_{RO,2}$) data matrix of the second segment with grid spacing $\Delta k_{PE,2}$ in the x-direction and $\Delta k_{RO,2}$ in the y-direction are interpolated on the ($\Delta k_x$, $\Delta k_y$) grid.

Given suitable selection of the grid spacings, this interpolation can be implemented with a particularly precise and particularly efficient sinc interpolation. The MR data of the k-space segments are complexly added. The determination of the MR image can take place via a 2D FFT of the ($\Delta kx$, $\Delta ky$) data matrix. Due to the linearity of the Fourier transformation, the superpositioning of the MR data can take place before or after the Fourier transformation. Before or after the interpolation, in k-space 210 a density compensation is implemented the compensates for denser data sampling in the overlap region of the two segments. A phase correction and movement compensation of the two segments can also be implemented before the superposition.

The coverage of k-space 210 with the two k-space segments 200-1, 200-2 and a non-quadratic field of view is illustrated in FIG. 7. In this example, $\text{FoV}_x = 2\text{FoV}_y$, κ1=1 and κ2=2.

Figure 8:
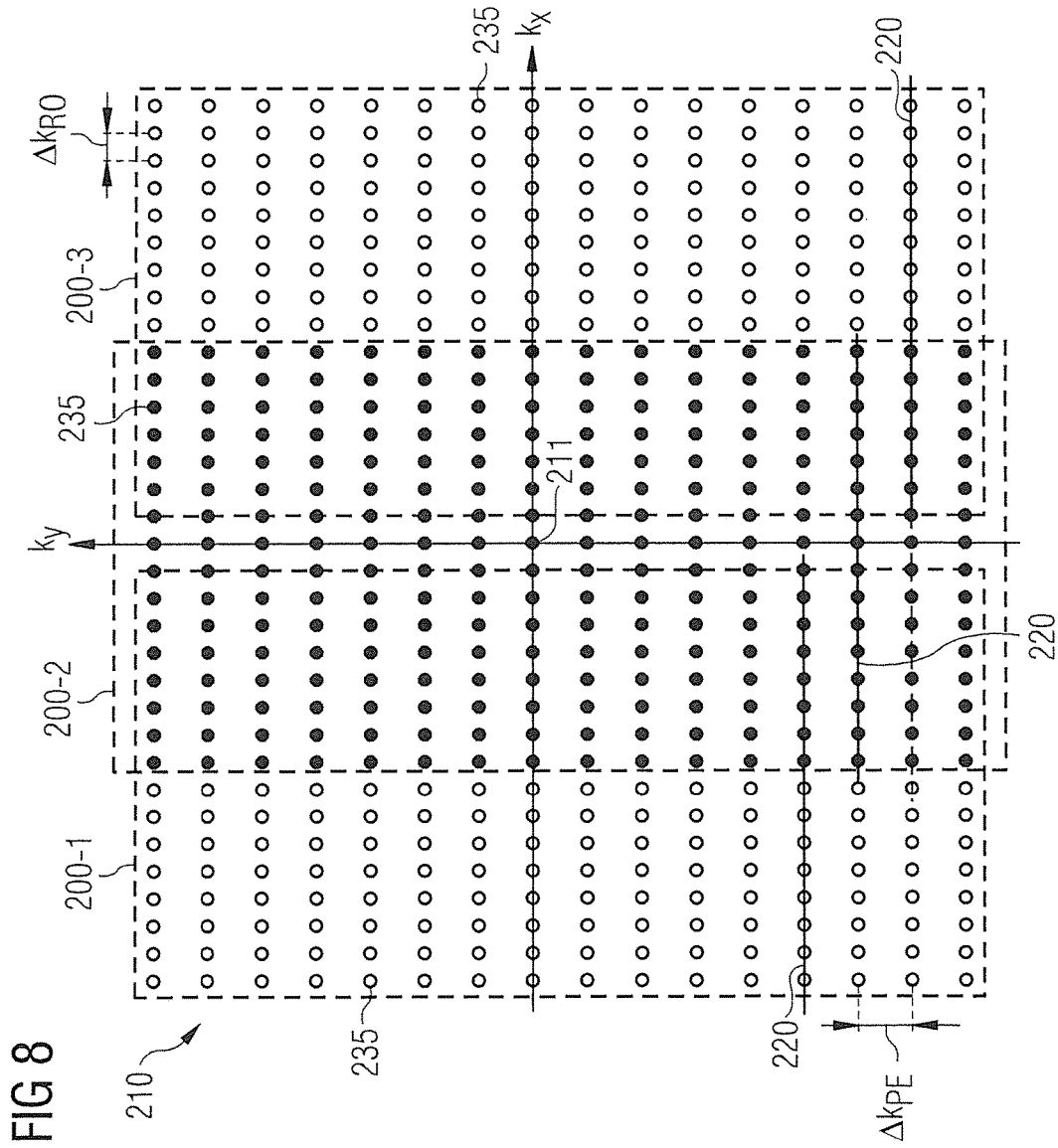
FIG. 8 depicts the shifting of three k-space segments along their short side according to different embodiments.

An additional exemplary embodiment of the invention in which k-space 210 is scanned by means of three k-space segments 200-1, 200-2, 200-3 is depicted in FIG. 8. The k-space segments 200-1, 200-2, 200-3 are respectively rectangular. Each k-space segment 200-1, 200-2, 200-3 comprises a long side along the phase encoding gradient field direction ky and a short side along the readout gradient field direction kx of the respective k-space segment 200-1, 200-2, 200-3. The k-space lines 220 of each k-space segment 200-1, 200-2, 200-3 are traversed multiple times to detect multiple gradient echoes by means of the multi-echo MR measurement sequence described in the preceding. In contrast to this, the different k-space lines 220 of each k-space segment 200-1, 200-2, 200-3 are acquired given the use of a gradient echo sequence or spin echo sequence after different excitation pulses 401-1. Given use of TGSE hybrid sequence, different lines of a segment are acquired in proximity to different spin echoes.

In contrast to the PROPELLER-based techniques as discussed above (for example with regard to FIGS. 6 and 7), the different k-space segments 200-1, 200-2, 200-3 are not rotated counter to one another around the k-space center 211. Rather, the three k-space segments 200-1, 200-2, 200-3 are shifted counter to one another essentially in parallel with the short side, i.e. in parallel with the readout gradient field direction kx. The shift of the k-space segments 200-1, 200-2, 200-3 along the readout gradient field direction kx is designed such that all k-space segments 200-1, 200-2, 200-3 together cover k-space 210 with the scope necessary to achieve a desired resolution.

In the example of FIG. 8, the different k-space segments 200-1, 200-2, 200-3 partially overlap. However, it is not necessary that the k-space segments 200-1, 200-2, 200-3 partially overlap. A larger (smaller) degree of overlap can reduce (increase) the efficiency of the multi-echo MR measurement sequence. This is the case since MR data in the overlap region of the different k-space segments 200-1, 200-2, 200-3 are acquired multiple times. The repeatedly acquired MR data can be used to correct or alleviate artifacts of the MR images that could otherwise occur, for example as a result of a movement of the examined person between the detection of the gradient echoes for the different k-space segments 200-1, 200-2, 200-3.

The shift of the k-space segments 200-1, 200-2, 200-3 along the readout gradient field direction kx can be achieved particularly simply via a corresponding selection of the readout pre-phasing gradient 403-1. An additional readout pre-phasing moment can be achieved via the specific dimensioning of the readout pre-phasing gradient 403-1. If the three k-space segments 200-1, 200-2, 200-3 in the example of FIG. 8 are acquired with the sequence from FIG. 3, for example, and if A is the integral of the readout gradient over the readout interval, a shift in k-space by an edge length of the k-space segment opposite to/along the readout direction is then achieved via an additional readout pre-phasing moment of minus/plus A to acquire the first/third k-space segment 200-1, 200-3. This shift would correspond to segments that specifically do not overlap. For overlapping segments, the magnitude of the additional readout pre-phasing gradient is accordingly selected to be smaller.

Figure 9:
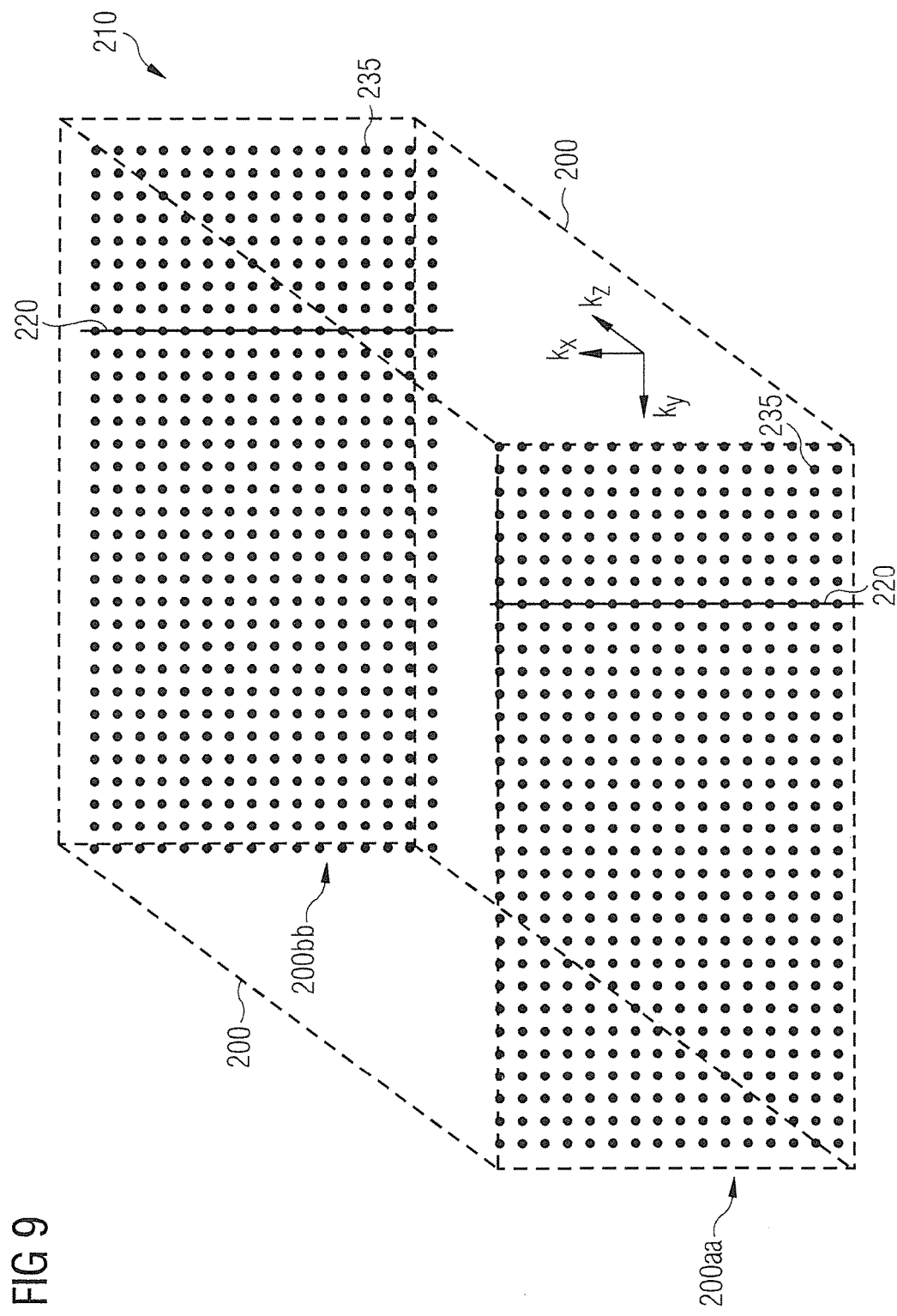
FIG. 9 depicts a k-space segment according to different embodiments that comprises two parallel 2D sub-segments.

In FIG. 9, a cuboid k-space segment 200 is depicted. The k-space segment 200 includes two rectangular 2D sub-segments 200aa, 200bb that are shifted counter to one another along the slice selection gradient field direction k-space, this is a 3D k-space segment 200. Furthermore, k-space lines 220 for the two sub-segments 200aa, 200bb are drawn in FIG. 9. The k-space lines 220 are again oriented along the short side of the rectangular sub-segments 200aa, 200bb or, respectively, along the readout gradient field direction kx. In general, techniques described in the preceding with regard to the 2D k-space segments can also be applied to the sub-segments 200aa, 200bb of a 3D k-space segment 200.

In FIG. 10, a sequence scheme is depicted that enables the acquisition of MR data for the readout points 235 as they are depicted in FIG. 9. An additional phase encoding gradient field 402a to select one of the sub-segments 200aa, 200bb is switched along the slice selection direction 301. Depending on the selection of the additional phase encoding gradient field 402a, a greater or smaller number of sub-segments 200*aa*, 200*bb* can be realized and the spacing between two adjacent sub-segments 200*aa*, 200*bb* along the slice selection gradient field direction kz can be selected in a well-defined manner.

Figure 11B:
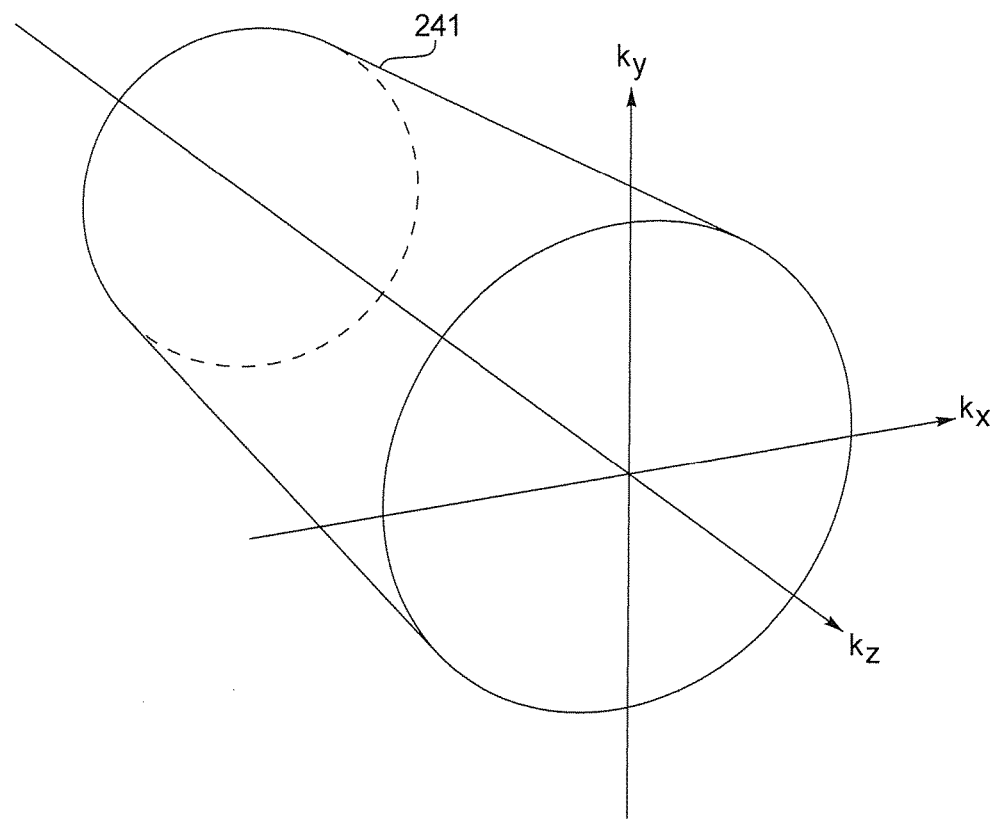
FIG. 11B depicts a cylinder in k-space that is scanned via rotation and/or tilting of 3D k-space segments.

It is possible to use the 3D k-space segments 200—as they have been discussed in the preceding with regard to FIGS. 9 and 10—by tilting and/or rotating and/or shifting within k-space 210 to cover said k-space 210. For example, the k-space segments 200 can be rotated counter to one another along the plane defined by the readout gradient field direction kx and either the first phase encoding direction ky or the slice selection direction kz. It would also be possible that the 3D k-space segments 200 (as they have been discussed in the preceding with regard to FIGS. 9 and 10) are rotated counter to one another around the k-space center 211 such that they scan a sphere 240 in k-space 210 (see FIG. 11A) or a cylinder 241 (see FIG. 11B).

Figure 12:
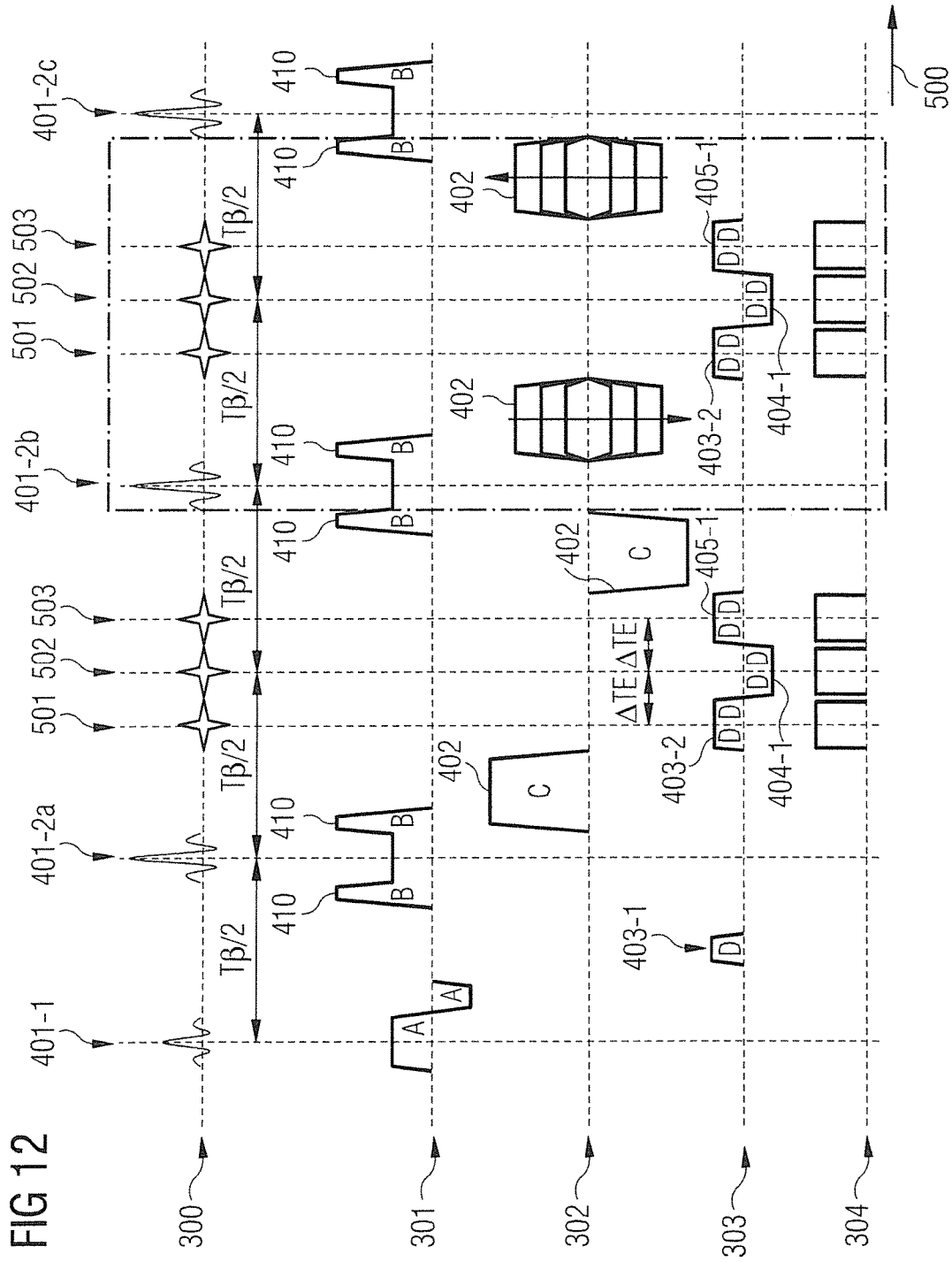
FIG. 12 depicts a spin echo/gradient echo hybrid sequence according to different embodiments.

The detection of the gradient echoes at the different echo points in time 501, 502, 503 for a bipolar gradient echo train with the readout gradients 403-2, 404-1, 405-1 is depicted in FIG. 12. The detection of the gradient echoes takes place within the scope of a spin echo/gradient echo hybrid sequence. The gradient echoes (illustrated by stars in FIG. 12) are respectively detected at a refocusing pulse 401-2*a*, 401-2*b*, 401-2*c*. The portion of the spin echo/gradient echo hybrid sequence that is emphasized by the dot-dash line is repeated for different k-space lines 220. Upon repetition, the moment of the phase encoding gradient 402 is thus varied. Finally, a spoiler gradient is switched to dephase the remaining transverse magnetization (not shown in FIG. 12).

If it is thereby achieved that all phase encoding lines of a k-space segment are acquired in one echo train, problems that result from a patient movement are thus reduced: the duration of one echo train is normally so short that movement that occurs during the acquisition of a k-space segment is "frozen". The remaining movement that occurs between the acquisition of different k-space segments can be corrected (as is known from conventional PROPELLER imaging) or reduced by the weighting of the individual k-space segments or, respectively, leads to relative minor image artifacts in comparison to Cartesian imaging.

For example, it is possible that the second echo point in time 402 can be temporally coincident with the spin echo formed by the respective refocusing pulse 401-2*a*, 401-2*b*, 401-2*c*. If the echo spacing ΔTE between successive gradient echoes is thereby selected such that the phase evolution difference between fat and water amounts to 180°, three contrasts with phase shift −180°, 0, 180° are thus achieved. The respective second gradient echo 502 coincides with the spin echo and is thus in-phase; the two others, 501 and 503, are opposed in phase.

From FIG. 12 it can be seen that the different refocusing pulses 401-2*a*, 401-2*b*, 401-2*c* are part of a series of multiple refocusing pulses that follow the RF excitation pulse 401-1. A pre-phasing readout gradient field 403-1 is applied between the RF excitation pulse 401-1 and the first refocusing pulse 401-2*a*. Instead of the bipolar gradient echoes 403-2, 404-1, 405-1, corresponding techniques are also possible with monopolar readout gradient fields.

Figure 13:
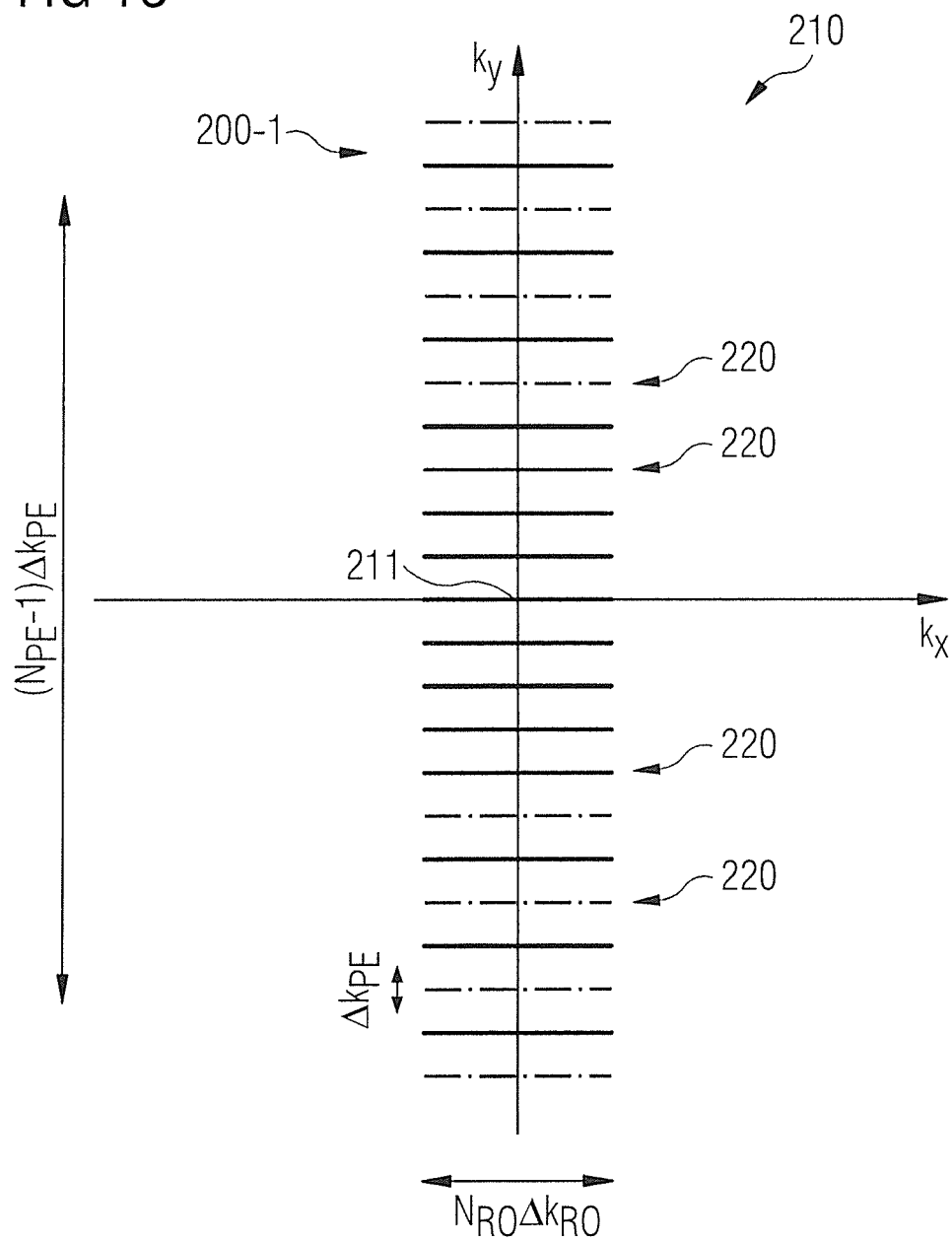
FIG. 13 depicts a k-space segment that is undersampled in each line.

The undersampling of a k-space segment 200-1 is illustrated in FIG. 13. The dash-dot k-space lines 220 are not measured during the data acquisition. Undersampling means that the density of measured sample points 235 that is required according to the Nyquist theorem is not met. Techniques of ppa imaging can be used for substation of the unmeasured k-space lines 220 insofar as more acquisition coils and what are known as coil calibration data are present.

Coil calibration data are normally the data of low-resolution images that are sufficiently sampled and that are acquired with the same acquisition coils. Various ppa techniques can be used to calculate the missing k-space lines 200, for example techniques operating in k-space such as GRAPPA or techniques operating in image space such as SENSE. Given what are known as auto-calibrating techniques, coil calibration data (ACS data) can be acquired via dense sampling, for example near the k-space center 211. This is schematically illustrated in FIG. 13 in that no missing k-space lines 220 are present near the k-space center 211.

For example, it is possible that the ACS data are acquired only for a k-space segment 200-1, and are reconstructed from these ACS data for the additional k-space segments. For these additional k-space segments, the ACS data can be obtained with the aid of a gridding operation or with the aid of a share operation in k-space 210 via rotation of the acquired ACS data. Alternatively, the region near the k-space center 211 can be densely sampled for multiple or all k-space segments to acquire the ACS data.

Figure 14:
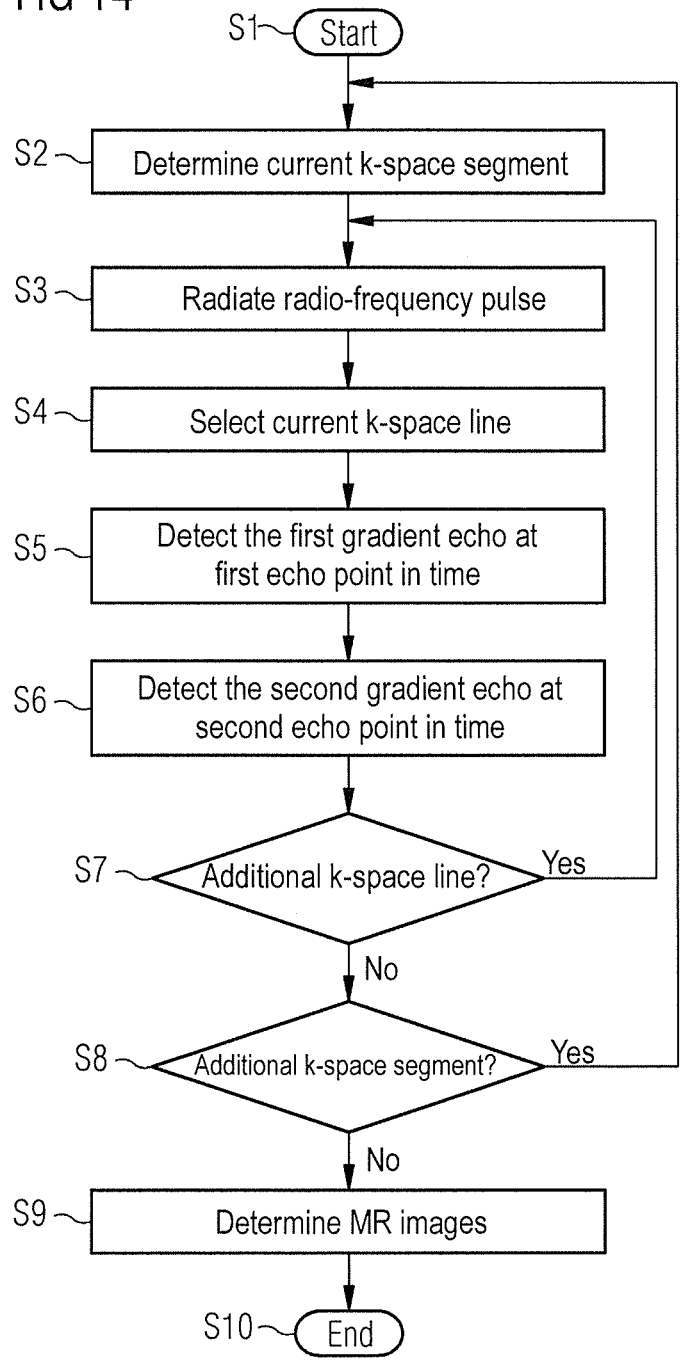
FIG. 14 is a flowchart of a method to determine an MR image according to different embodiments.

A flow chart of a method to determine MR images by means of a multi-echo MR measurement sequence is depicted in FIG. 14.

The method begins in Step S1. First, a current k-space segment is determined in Step S2. In Step S3, an RF pulse is then radiated to excite the transverse magnetization. In Step S4, a current k-space line of the current k-space segment is selected, in particular by applying a phase encoding gradient field.

The detection of the first gradient echo at a first echo point in time takes place in Step S5. The detection of a second gradient echo at a second echo point in time subsequently takes place in Step S6. Optionally, additional gradient echoes can subsequently be detected.

In Step S7 a check is made whether an additional k-space line should be scanned for the current k-space segment. If this is the case, Steps S3-S7 are implemented again. Otherwise, in Step S8 a check is made whether an additional k-space segment should be scanned. If this is the case, Steps S2-S7 are implemented again. Otherwise, in Step S9 two MR images are respectively determined for the first and second echo point in time. The method ends in Step S10.

Naturally, the features of the embodiments and aspects of the invention that are described herein can be combined with one another. In particular, the features can be used not only in the described combinations but also in other combinations or individually.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to generate multiple magnetic resonance (MR) images of an examination subject, comprising:

operating an MR data acquisition unit, in which said examination is situated, according to a multi-echo MR data acquisition sequence to acquire raw MR data from the examination subject;

entering said raw MR data acquired from the examination subject into an electronic memory organized as k-space comprising a plurality of rectangular k-space segments each comprising a plurality of k-space lines along which said raw MR data are entered;

by operating said MR data acquisition unit with said multi-echo MR data acquisition sequence, producing, for each k-space line, a first gradient echo at a first echo point in time and a second gradient echo at a later second echo point in time;

operating said data acquisition unit with said multi-echo MR data acquisition sequence by, for each k-space line, radiating a radio-frequency pulse that manipulates a transverse magnetization of nuclear spins in the examination subject, activating a phase encoding gradient field that phase codes the raw MR data of the respective k-space line, activating a first readout gradient field and a second readout gradient field that, in combination with the manipulation of the transverse magnetization produced by said radio-frequency pulse, respectively produce said first gradient echo and said second gradient echo, and reading out raw MR data, for the respective k-space line, of said first gradient echo during activation of said first readout gradient field in a time interval around said first echo point in time, and reading out raw MR data, for the respective k-space line, of said second gradient echo during activation of said second readout gradient field in a time interval around said second echo point in time;

orienting said rectangular k-space segments in k-space with a longer side of each k-space segment oriented along a direction in the respective k-space segment that is defined by said phase encoding gradient field;

orienting said rectangular k-space segments in k-space with a short side of each k-space segment oriented along a direction of the respective k-space segment that is defined by said readout gradient fields; and in a processor having access to said memory, reconstructing individual MR images from raw data in said k-space acquired at identical echo times, respectively.

2. A method as claimed in claim 1 comprising:
entering said raw data into said k-space segments with said k-space lines oriented parallel to each other;
orienting said long side of said k-space segments orthogonally to said k-space lines; and
orienting said short side of said k-space segments along said k-space lines.

3. A method as claimed in claim 2, comprising:
in said multi-echo MR data acquisition sequence, activating a slice selection gradient field during the radiation of said radiofrequency pulse; and
shifting said k-space segments essentially parallel to said short side of said k-space segments in a plane defined by said slice selection gradient field.

4. A method as claimed in claim 1 wherein k-space comprises a k-space center, and comprising:
organizing said k-space segments to all include said k-space center; and
in said multi-echo MR data acquisition sequence, activating a slice selection gradient field during the radiation of said radiofrequency pulse, and rotating said k-space segments in a plane defined by said slice selection gradient field around said k-space center.

5. A method as claimed in claim 4 said k-space comprising exactly two of said k-space segments; and
rotating said k-space segments to each other by an angle of approximately 90° around said k-space center in said plane defined by said slice selection gradient field.

6. A method as claimed in claim 1 wherein k-space comprises a k-space center, said method comprising:
organizing said k-space segments in k-space to all include said k-space center; and
rotating said k-space segments to each other around said k-space center in order to enter said raw data into a sphere in k-space.

7. A method as claimed in claim 1 comprising:
organizing said k-space segments in three-dimensional k-space as cuboid k-space segments that each comprise a plurality of rectangular sub-segments;
in said multi-echo MR data acquisition sequence, activating a slice selection gradient field during the radiation of said radiofrequency pulse, and activating an additional phase encoding gradient field that shifts said plurality of rectangular sub-segments to each other along a direction defined by said slice selection gradient field;
orienting a long side of the plurality of sub-segments along a direction defined by the phase encoding gradient field or by the additional phase encoding gradient field; and
orienting a short side of the plurality of sub-segments along a direction of the respective k-space segment defined by said first and second readout gradient fields.

8. A method as claimed in claim 7 wherein k-space comprises a k-space center, said method comprising:
orienting said k-space segments in k-space so as to all include said k-space center; and
rotating said k-space segments to each other in a plane defined by the readout gradient field and a plane defined by the phase encoding gradient field or the additional phase encoding gradient field.

9. A method as claimed in claim 7 wherein k-space comprises a k-space center, and said method comprising:
organizing said k-space segments to all include said k-space center; and
rotating said k-space segments to each other around said k-space center to enter said raw data into a sphere or a cylinder in k-space.

10. A method as claimed in claim 1 comprising forming said gradient echoes by operating said MR data acquisition unit with a spin echo/gradient echo hybrid sequence, as said multi-echo MR data acquisition sequence.

11. A method as claimed in claim 10 comprising, in said spin echo/gradient echo hybrid sequence, radiating said radio-frequency pulse as a refocusing pulse to generate a spin echo of said transverse magnetization, with said first echo point in time and said second echo point in time being within a time duration of said spin echo.

12. A method as claimed in claim 11 comprising:
radiating said refocusing pulse as one of a series of multiple refocusing pulses that follow a radio-frequency excitation pulse to excite said transverse magnetization; and
after one of said refocusing pulses in said series of multiple refocusing pulses, acquiring raw data for at least one of the k-space lines of at least one of said k-space segments such that all k-space data required for said at least one particular segment is acquired by this series of multiple refocusing pulses.

13. A method as claimed in claim 1 comprising, in said multi-echo MR data acquisition sequence, acquiring raw data from successive gradient echoes during activation of respective readout gradient fields with different polarity.

14. A method as claimed in claim 1 comprising reconstructing said MR images from raw data in said k-space segments acquired at identical echo times using a reconstruction technique selected from the group consisting of regridding in k-space, density compensation in k-space, successive shear operation in k-space, parallel imaging techniques, combining, for each echo time, multiple intermediate MR images respectively reconstructed from each k-space segment, or combining, for each echo time, MR data of multiple k-space segments and reconstructing images from the combined MR data.

15. A method as claimed in claim 1 comprising reconstructing said MR images from raw data of gradient echoes of said k-space segments acquired at identical echo times, according to a GRAPPA (Generalized Autocalibrating Partially Parallel Acquisition) technique.

16. A method as claimed in claim 1 comprising:
    operating said MR data acquisition unit with said multi-echo MR data acquisition sequence to produce a third gradient echo at a third echo point in time, which follows said first echo point in time and said second echo point in time; and
    acquiring raw data for a respective k-space line by activating a third readout gradient during a time interval around said third echo point in time.

17. A magnetic resonance (MR) apparatus, comprising:
    an MR data acquisition unit;
    a control unit configured to operate said MR data acquisition unit, in which an examination subject is situated, according to a multi-echo MR data acquisition sequence to acquire raw MR data from the examination subject;
    said control unit being configured to enter said raw MR data acquired from the examination subject into an electronic memory organized as k-space comprising a plurality of rectangular k-space segments each comprising a plurality of k-space lines along which said raw MR data are entered;
    said operation of said MR data acquisition unit with said multi-echo MR data acquisition sequence, producing, for each k-space line, a first gradient echo at a first echo point in time and a second gradient echo at a later second echo point in time;
    said control unit being configured to operate said data acquisition unit with said multi-echo MR data acquisition sequence by, for each k-space line, radiating a radio-frequency pulse that manipulates a transverse magnetization of nuclear spins in the examination subject, activating a phase encoding gradient field that phase codes the raw MR data of the respective k-space line, activating a first readout gradient field and a second readout gradient field that, in combination with the manipulation of the transverse magnetization produced by said radio-frequency pulse, respectively produce said first gradient echo and said second gradient echo, and reading out raw MR data, for the respective k-space line, of said first gradient echo during activation of said first readout gradient field in a time interval around said first echo point in time, and reading out raw MR data, for the respective k-space line, of said second gradient echo during activation of said second readout gradient field in a time interval around said second echo point in time;
    said control unit being configured to enter said raw data into said electronic memory with said rectangular k-space segments oriented in k-space with a longer side of each k-space segment oriented along a direction in the respective k-space segment that is defined by said phase encoding gradient field;
    said control unit being configured to enter said raw data into said electronic memory with said rectangular k-space segments oriented in k-space with a short side of each k-space segment oriented along a direction of the respective k-space segment that is defined by said readout gradient fields; and
    a processor having access to said memory, said processor being configured to reconstruct individual MRI images from said raw data in said k-space acquired at identical echo times, respectively.

* * * * *